United States Patent
Youn et al.

(10) Patent No.: US 8,750,018 B2
(45) Date of Patent: Jun. 10, 2014

(54) SENSE AMPLIFIER CIRCUITRY FOR RESISTIVE TYPE MEMORY

(75) Inventors: YongSik Youn, Cupertino, CA (US); Adrian Ong, Pleasanton, CA (US); Sooho Cha, Seoul (KR); Chan-kyung Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 13/488,432

(22) Filed: Jun. 4, 2012

(65) Prior Publication Data
US 2013/0322154 A1    Dec. 5, 2013

(51) Int. Cl.
*G11C 11/00*     (2006.01)
(52) U.S. Cl.
USPC ............................................. 365/148
(58) Field of Classification Search
CPC ................. G11C 13/0004; G11C 13/0069
USPC ........................................ 365/148, 205, 207
See application file for complete search history.

(56) References Cited

U.S. PATENT DOCUMENTS

| | | | |
|---|---|---|---|
| 6,055,178 A | 4/2000 | Naji | |
| 6,111,781 A | 8/2000 | Naji | |
| 7,839,676 B2 | 11/2010 | Kurose et al. | |
| 2012/0057400 A1 | 3/2012 | Kim et al. | |
| 2013/0235649 A1* | 9/2013 | Lindstadt et al. | ............. 365/148 |

* cited by examiner

*Primary Examiner* — Huan Hoang
(74) *Attorney, Agent, or Firm* — Renaissance IP Law Group LLP

(57) ABSTRACT

Example embodiments include a resistive type memory current sense amplifier circuit including differential output terminals, first and second input terminals, pre-charge transistors, and current modulating transistors coupled directly to the pre-charge transistors. The pre-charge configuration provides high peak currents to charge the bit line and reference line during a "ready" or "pre-charge" stage of operation of the current sense amplifier circuit. The current modulating transistors are configured to operate in a saturation region mode during at least a "set" or "amplification" stage. The current modulating transistors continuously average a bit line current and a reference line current during the "set" or "amplification" stage, thereby improving noise immunity of the circuit. During a "go" or "latch" stage of operation, a logical value "0" or "1" is latched at the differential output terminals based on positive feedback of a latch circuit.

27 Claims, 19 Drawing Sheets

(Precharge)

(Amplification)

(Latch+Rewrite)

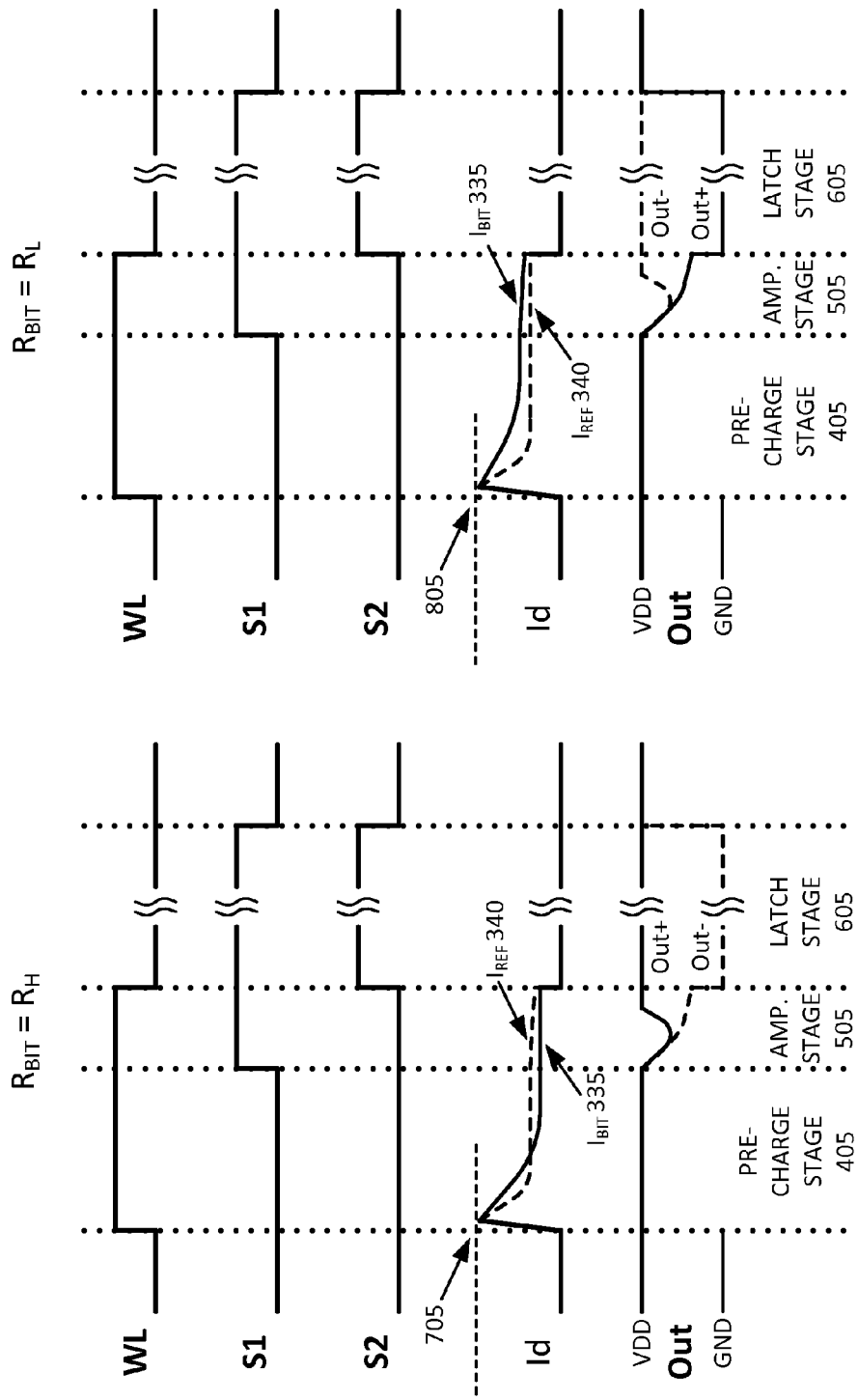

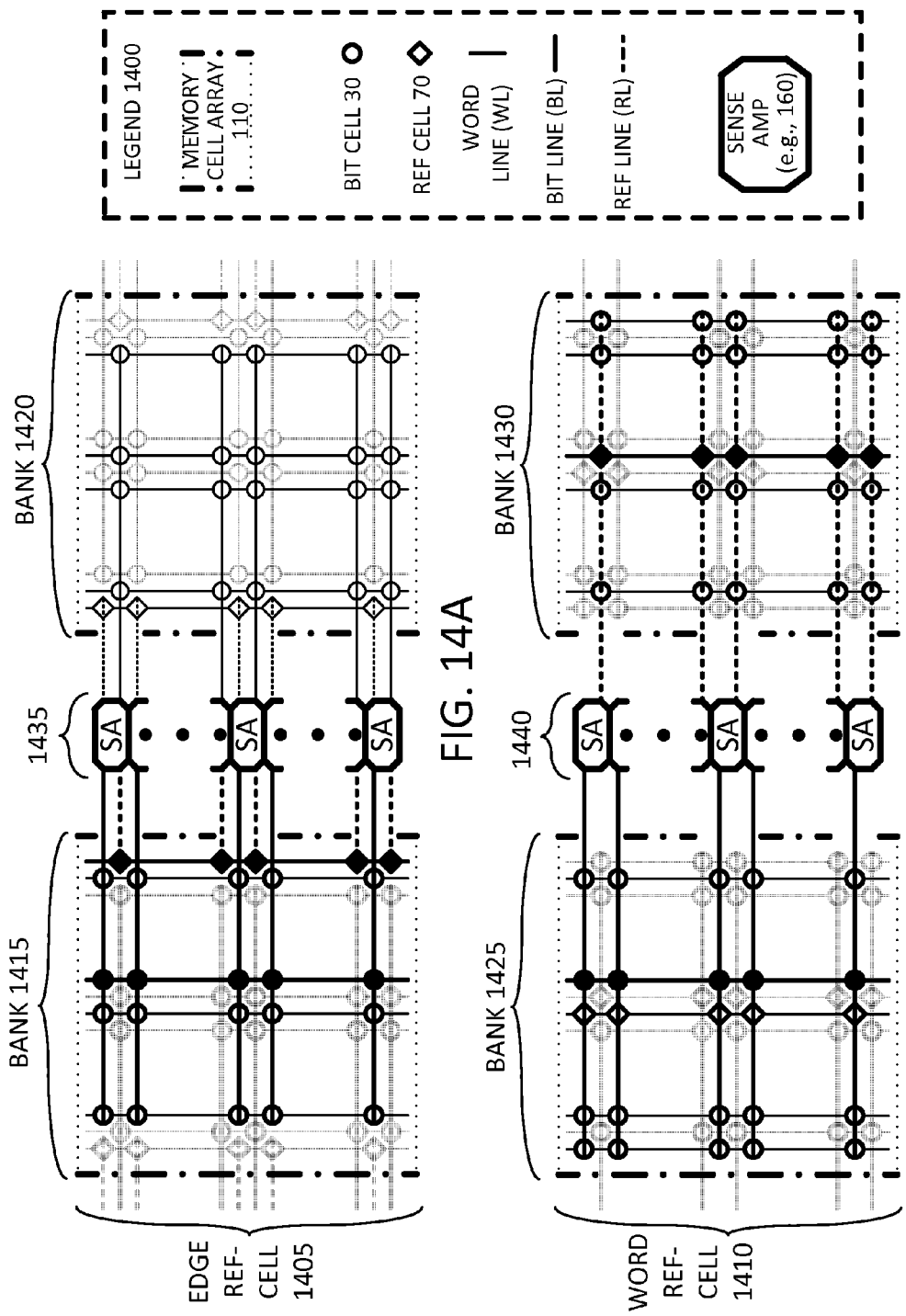

SENSE AMPLIFIER CIRCUITRY FOR RESISTIVE TYPE MEMORY

BACKGROUND

The present inventive concepts relate to sense amplifiers for resistive type memory circuits, and more particularly to current sense amplifiers.

Resistive type memories encompass a new generation of non-volatile memory and are expected to become more prevalent in the marketplace. Resistive type memories can include, for example, spin transfer torque (STT) magnetoresistive random-access memory (MRAM), MRAM (of the non-STT variety), memristor RAM, ReRAM, CBRAM, and the like.

FIG. 1A is a circuit diagram of a sense amplifier according to the prior art. Referring to FIG. 1A, a latch circuit is configured by MOS transistors M1, M2, M3, and M4. MOS transistors M5 and M6 correspond to the read current source IR1 and the reference current source IR2, respectively. A sense amplifier is configured by MOS transistors M7 and M8. An operation of the read circuit 15 includes (a) a pre-charge mode, (b) an amplification mode, and (c) a latch+rewrite mode. The modes are described below with reference to FIGS. 1B-1D. In an initial state, control signals φ1, φ2, and φ3 from a switch controller are set at a low ("L") state.

FIGS. 1B-1D are equivalent circuit diagrams of the circuit diagram of FIG. 1A associated with different stages of operation, in accordance with the prior art.

FIG. 1B shows an equivalent circuit in the pre-charge mode. The control signal φ2 is set at a high ("H") state to start pre-charging a read current path. A pre-charge current flows from the pre-charge transistors M5 and M6 (PMOS transistors) to the MRAM cell 13 and the reference cell 13' through the cross-coupled transistors M3 and M4 (NMOS transistors) serving as a part of the latch circuit and clamp transistors M11 and M12 (NMOS transistors) of FIG. 1A. In the pre-charge mode and a stable state, read data Out and /Out are set at a voltage close to a power supply voltage VSS by the pre-charge transistors M5 and M6 and an equalize transistor Meq (PMOS transistor). Therefore, the transistors M1 and M2 are in off states, and the latch circuit including transistors M1 to M4 does not operate.

FIG. 1C shows an equivalent circuit in an amplification mode. The control signal φ1 is set at "H", and the transistors M5, M6, and Meq are turned off. The data Out and /Out decrease from a power supply voltage VDD by threshold voltages of the transistors M1 and M2, amplification by positive feedback of the latch circuit including the MOS transistors M1 to M4, and the data Out and /Out are determined. At this time, the read current path is identical with a drive current path of the latch circuit, and the control signal φ1 goes to "H", so that the operation continuously is shifted from the pre-charge mode to the amplification mode. Although present in the overall circuit during the amplification mode, the clamp transistors M11 and M12 are not shown in FIG. 1C.

FIG. 1D shows an equivalent circuit in an latch+rewrite mode. As shown in FIG. 1D, when a voltage difference between outputs Out and /Out is sufficiently large, the control signal φ3 is set at "H" to turn the boost transistors M7 and M8 on, and amplification of the latch circuit including the transistors M1 to M4 is accelerated. When an output from the latch circuit, i.e., the data Out and /Out are determined, rewriting is performed.

Conventional sense amplifier technology used in resistive type memories can experience problems as the power supply voltages are decreasing over time. As the size of memory cells decreases and the density of memory devices increases over time, the power supply voltages used to supply power to the memory cells and associated control logic is also decreased. Whereas in times past the power supply voltage for a memory circuit may have been 5 Volts (V) or 3.3 V, for example, today a power supply voltage may supply voltages around 1.2 V or 1.3 V. Such low power supply voltages can cause voltage headroom problems in conventional sense amplifier circuitry as the saturation voltage of a transistor may not scale down proportionally to the supply voltage.

Problems associated with available voltage headroom within sense amplifiers are aggravated when too many transistors are configured in stacked structures, which can cause undesirable operation in one or more of the transistors. For example, a transistor that would be more effective if it operated in a saturation region mode in certain phases of the sense amplifier operation, may in reality be operating in a triode or linear region mode, thereby causing disadvantages in sense amplifier operation.

Other unique challenges are presented when attempting to develop sense amplifier technology associated with resistive type memories. For example, in an MRAM type memory cell, a destructive read or "read disturb" problem can occur if the sense amplifier causes excess current to flow through an MRAM memory cell when attempting to sense whether a "1" or a "0" is stored in the memory cell. In other words, the value of the memory cell can accidentally be switched from a "1" to a "0" or vice versa.

One approach to avoid the read disturb problem is for the sense amplifier to reduce the read current. However, unintended side effects of this approach can include slower response times, a reduction in the output signal level, a reduction in the data read rate, and higher susceptibility to unwanted electromagnetic noise and other disturbances. Such performance degradation is undesirable. Moreover, such electromagnetic noise itself can be disruptive to the data stored in the cell or to the sense amplifier output signals.

It would be desirable to provide a current sense amplifier circuit for resistive type memories, which provides fast response times, strong noise immunity, low voltage operation, larger voltage headroom, and fewer sense errors.

BRIEF SUMMARY

According to one embodiment of the inventive concept, a resistive type memory current sense amplifier circuit includes a first differential output terminal configured to output a first output signal, a second differential output terminal configured to output a second output signal opposite the first output signal, a first input terminal coupled to a bit line associated with a resistive type memory cell, a second input terminal coupled to a reference line associated with a reference memory cell, a first pre-charge transistor coupled to a power supply and to the first differential output terminal, the first pre-charge transistor being configured to pre-charge the bit line associated with the memory cell, a second pre-charge transistor coupled to the power supply and to the second differential output terminal, the second pre-charge transistor being configured to pre-charge the reference line associated with the reference memory cell, a first current modulating transistor coupled directly to the first differential output terminal and to the first pre-charge transistor, the first current modulating transistor being configured to operate in a saturation region mode during at least an amplification stage of the current sense amplifier circuit, and a second current modulating transistor coupled directly to the second differential output terminal and to the second pre-charge transistor, the second current modulating transistor being configured to operate in the saturation region mode during at least the amplification stage of the current sense amplifier circuit.

According to another example embodiment, a method includes, in a pre-charge stage of a current sense amplifier circuit, pre-charging, by a first pre-charge transistor and a second pre-charge transistor, a bit line and a reference line, respectively; in an amplification stage of the current sense amplifier circuit, continuously averaging a bit line current and a reference line current associated with the bit line and the reference line, respectively; and in a latch stage of the current sense amplifier circuit, latching, by a latch circuit, a logical value "0" or logical value "1" at first or second differential output terminals, respectively, using positive feedback of the latch circuit.

According to yet another example embodiment, a memory device is provided including a plurality of word lines, a plurality of bit lines arranged to intersect with the word lines, a plurality of memory blocks, each memory block including resistive type memory cells arranged at intersection portions between the word lines and the bit lines, a plurality of current sense amplifier circuits, each current sense amplifier circuit being associated with a corresponding bit line of one of the memory blocks, and a current mirror circuit coupled to the plurality of current sense amplifiers.

The foregoing and other features and advantages of the invention will become more readily apparent from the following detailed description of the example embodiments, which proceeds with reference to the accompanying drawings.

BRIEF DESCRIPTION OF THE DRAWINGS

FIG. 8 is an example waveform diagram showing waveforms associated with different stages of the sense amplifier circuit of FIG. 4 when a memory cell resistance is previously set to high, in accordance with some embodiments of the inventive concept.

FIG. 9 is an example waveform diagram showing waveforms associated with different stages of the sense amplifier circuit of FIG. 4 when a memory cell resistance is previously set to low, in accordance with some embodiments of the inventive concept.

FIG. 14A is an example diagram of a layout of the memory cell array and associated memory banks in an edge-reference cell arrangement or pattern, in accordance with another embodiment of the inventive concept.

FIG. 14B is an example diagram of a layout of the memory cell array and associated memory banks in a word-reference cell arrangement or pattern, in accordance with another embodiment of the inventive concept.

DETAILED DESCRIPTION

Reference will now be made in detail to embodiments of the invention, examples of which are illustrated in the accompanying drawings. In the following detailed description, numerous specific details are set forth to enable a thorough understanding of the present invention. It should be understood, however, that persons having ordinary skill in the art may practice the present invention without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Figure 1A:
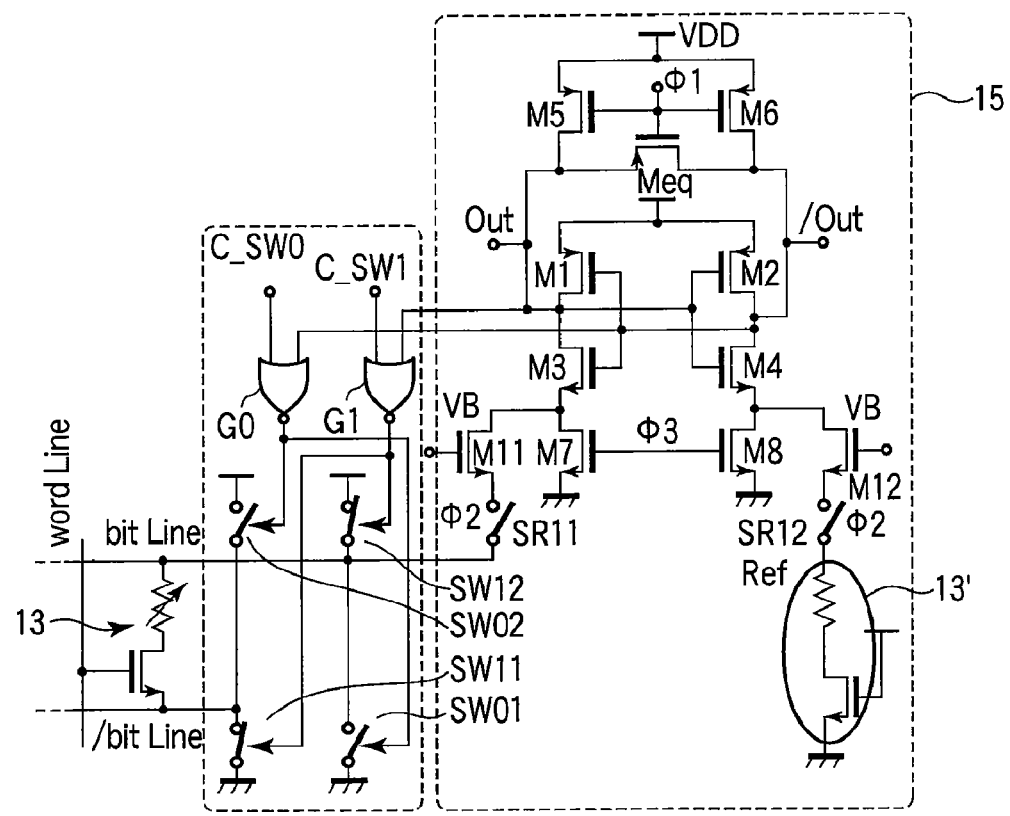
FIG. 1A is a circuit diagram of a sense amplifier according to the prior art.
Figure 1B:
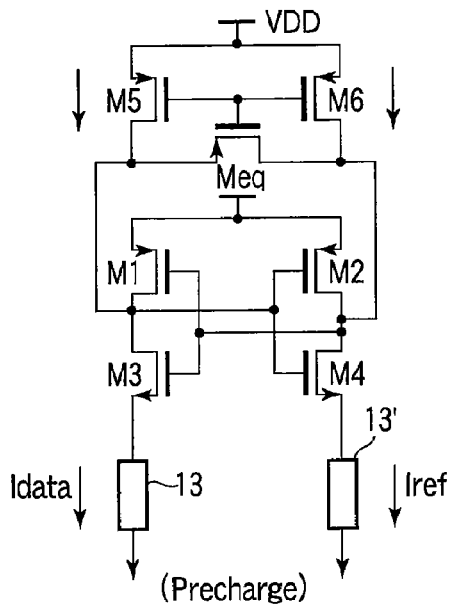
FIGS. 1B-1D are equivalent circuit diagrams of the circuit diagram of FIG. 1A associated with different stages of operation, in accordance with the prior art.
Figure 1C:
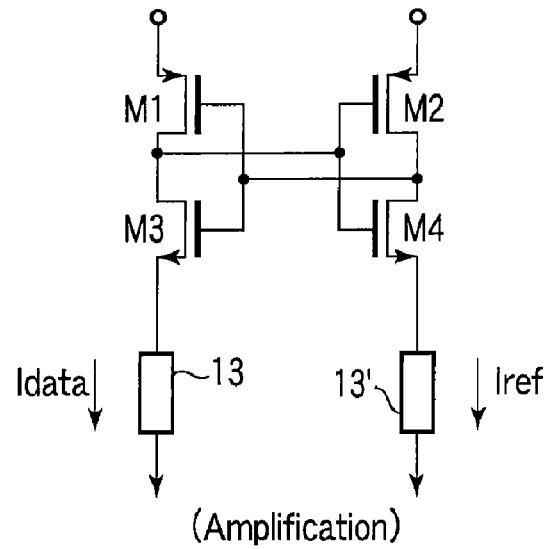
Figure 1D:
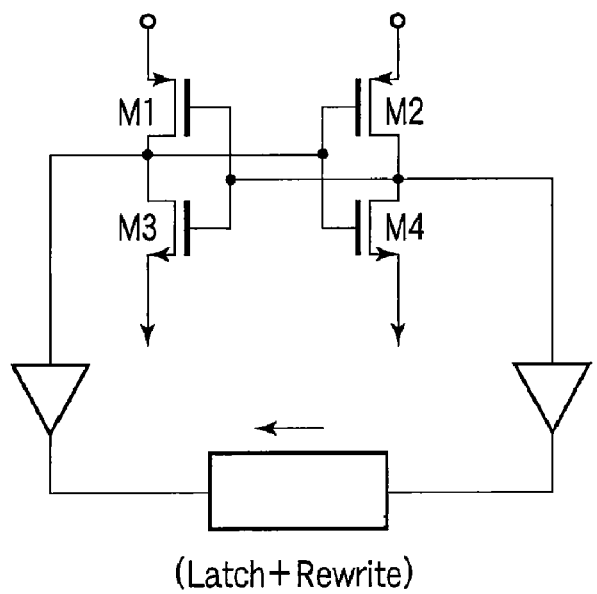
Figure 2:
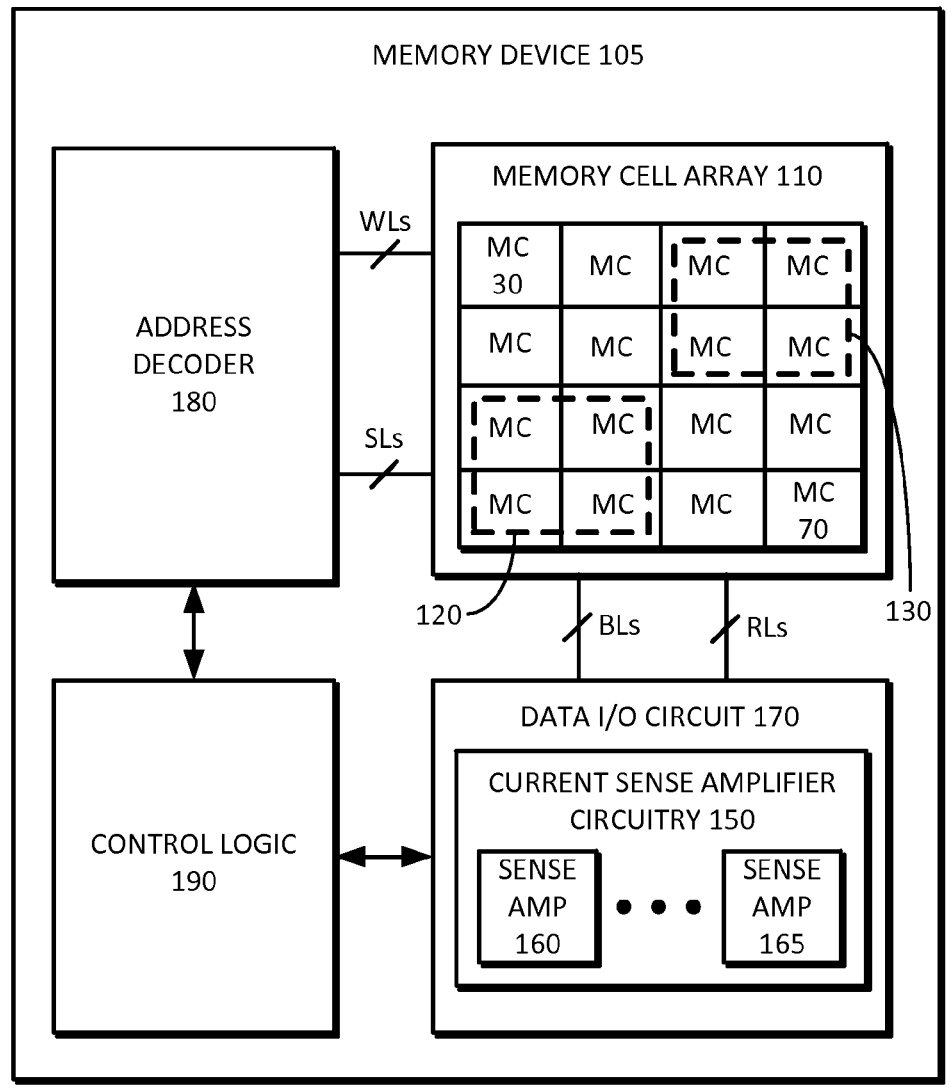
FIG. 2 is an example block diagram of a memory device including current sense amplifier circuitry, in accordance with embodiments of the inventive concept.

FIG. 2 is an example block diagram of a memory device 105 including current sense amplifier circuitry 150, in accordance with embodiments of the inventive concept. Referring to FIG. 3, the memory device 105 includes a memory cell array 110, a data I/O circuit 170, an address decoder 180, and a control logic 190. The data I/O circuit 170 may include the current sense amplifier circuitry 150 for sensing or reading bit information stored in memory cell array 110, in accordance with embodiments of the inventive concept.

Referring to FIG. 3, the memory cell array 110 may have a plurality of memory cells MC 30, each of which stores one or more data bits. The memory cells MC may be connected to a plurality of word lines WLs, a plurality of source lines SLs, and a plurality of bit lines BLs. The bit lines BLs may be arranged to intersect with the word lines WLs. In addition, some of the memory cells may be reference memory cells 70, as further described below. The reference memory cells 70 may be connected to a plurality of reference lines RLs.

The memory cells may be arranged at intersection portions (not shown) between the word lines and the bit lines. The memory cells 30 may be grouped into memory blocks such as blocks 120 and 130. For example, for a 1 Mb memory block, one thousand (1000) word lines and one thousand (1000) bit lines can be associated with the memory block. Thus, each bit line associated with such a block would have one thousand (1000) memory cells associated therewith. It will be understood, however, that any suitable number of word lines, bit lines, and/or memory cells can be associated with each block. The current sense amplifier circuitry 150 may include a plurality of current sense amplifier circuits (e.g., 160 and 165). Each current sense amplifier circuit is associated with a corresponding bit line of one of the memory blocks (e.g., 120 and 130), respectively. In other words, each bit line BL has a corresponding current sense amplifier (e.g., 160, 165) associated therewith.

The address decoder 180 may be connected to the memory cell array 110 via the word lines WLs and source lines SLs. The address decoder 180 may operate responsive to the control of the control logic 190. The address decoder 180 may decode an input address to select the word lines WLs and source lines SLs. The address decoder 180 may receive power (e.g., a voltage or a current) from the control logic 190 to provide it to a selected or unselected word line.

The data input/output circuit 170 may be connected to the memory cell array 110 via the bit lines BLs. More specifically, each of the current sense amplifiers (e.g., 160 and 165) can be coupled to a corresponding bit line of one of the memory blocks (e.g., 120 and 130). The data input/output circuit 170 may operate responsive to the control of the control logic 190. The data input/output circuit 170 may select a bit line in response to a bit line selection signal (not shown) from the address decoder 180. The data input/output circuit 170 may receive power (e.g., a voltage or a current) from the control logic 190 to provide it to a selected bit line.

The control logic 190 may be configured to control an overall operation of the memory device 105. The control logic 190 may be supplied with external power and/or control signals. The control logic 190 may generate power needed for an internal operation using the external power. The control logic 190 may control read, write, and/or erase operations in response to the control signals.

Figure 3A:
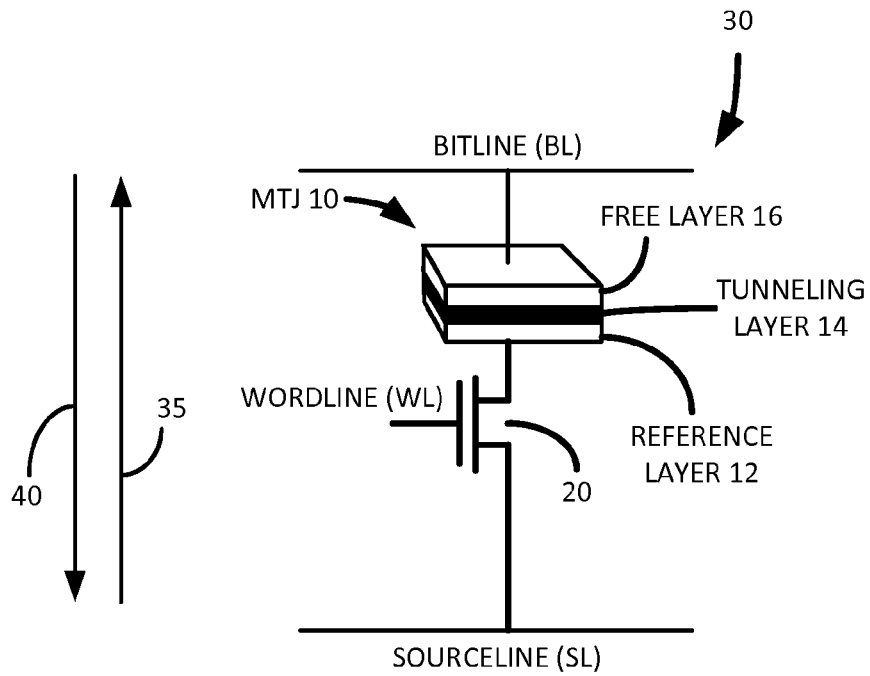
FIGS. 3A and 3B are a schematic diagram of an example STT MRAM memory cell, which can be included in the memory array of the memory device of FIG. 2.
Figure 3B:
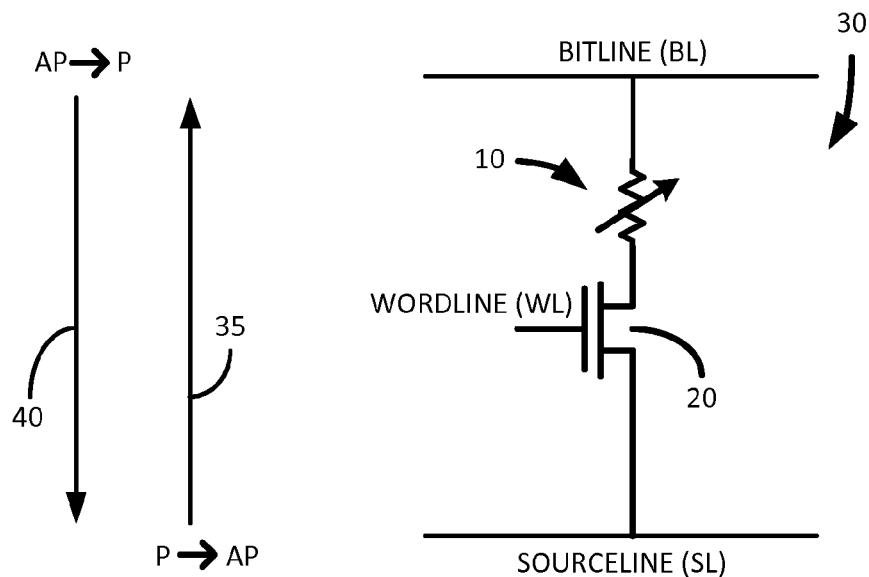

FIGS. 3A and 3B are a schematic diagram of an example STT MRAM memory cell 30 included in the memory cell array 110 of the memory device 105 of FIG. 2.

In some embodiments, the memory cell array 110 includes a plurality of spin transfer torque (STT) magnetoresistive random-access memory (MRAM) memory cells. It will be understood, however, that inventive concepts described herein apply to resistive memories of other types, such as MRAM (of the non-STT variety), memristor RAM, ReRAM, CBRAM, and the like.

FIG. 3A shows a magnetic tunnel junction (MTJ) 10, which forms a variable resistor in an STT-MRAM type memory cell, and an associated select transistor 20, together forming an STT-MRAM cell 30. The MTJ 10 includes a reference or pinned layer 12, a free layer 16, and a tunneling layer 14 disposed between the reference layer 12 and the free layer 16. Transistor 20 is often an NMOS transistor due to its inherently higher current drive, lower threshold voltage, and smaller area relative to a PMOS transistor. The current used to write a "1" in MRAM 30 can be different than the current used to write a "0". The asymmetry in the direction of current flow during these two write conditions is caused by the asymmetry in the gate-to-source voltage of transistor 20.

In the following description, an MRAM cell is defined as being in a logic "0" state when the free and reference layers of its associated MTJ are in a parallel (P) state, i.e., the MTJ exhibits a low resistance. Conversely, an MRAM cell is defined as being in a logic "1" state when the free and reference layers of its associated MTJ are in an anti-parallel (AP) state, i.e., the MTJ exhibits a high resistance. It will be understood that in other embodiments, the MRAM cell can be defined as being in the logic "0" state when in an AP state, and the logic "1" state when in a P state. Furthermore, in the following, it is assumed that the reference layer of the MTJ 10 faces its associated select transistor, as shown in FIG. 3A.

Therefore, in accordance with the discussion above, a current flowing along the direction of arrow 35 (i.e., the up direction) either (i) causes a switch from the P state to the AP state thus to write a "1", or (ii) stabilizes the previously established AP state of the associated MTJ. Likewise, a current flowing along the direction of arrow 40 (i.e., the down direction) either (i) causes a switch from the AP state to the P state thus to write a "0", or (ii) stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 either (i) causes a switch from the AP state to the P, or (ii) stabilizes the previously established P state of the associated MTJ. Likewise, in such embodiments, a current flowing along the direction of arrow 40 either (i) causes a switch from the P state to the AP state, or (ii) stabilizes the previously established AP state.

FIG. 3B is a schematic representation of MRAM 30 of FIG. 3A in which MTJ 10 is shown as a storage element whose resistance varies depending on the data stored therein. The MTJ 10 changes its state (i) from P to AP when the current flows along arrow 35, and/or (ii) from AP to P when the current flows along arrow 40.

The voltage required to switch the MTJ 10 from an AP state to a P state, or vice versa, must exceed a critical value $V_c$. The current corresponding to this voltage is referred to as the critical or switching current $I_c$. Under a normal operating mode, to transition from the P state (i.e., low resistance state) to AP state (i.e., high resistance state), a positive voltage of $V_c$ is applied so that a current level of at least the switching current $I_c$ flows through the memory cell. Once in the AP state, removing the applied voltage does not affect the state of the MTJ 10. Likewise, to transition from the AP state to the P state under the normal operating mode, a negative voltage of $V_c$ is applied so that a current level of at least the switching current $I_c$ flows through the memory cell in the opposite direction. Once in the P state, removing the applied voltage does not affect the state of the MTJ 10.

In other words, MTJ 10 can be switched from an anti-parallel state (i.e., high resistance state, or logic "1" state) to a parallel state so as to store a "0" (i.e., low resistance state, or logic "0" state). Assuming that MTJ 10 is initially in a logic "1" or AP state, to store a "0", under the normal operating mode, a current at least as great or greater than the critical current $I_c$ is caused to flow through transistor 20 in the direction of arrow 40. To achieve this, the source node (SL or source line) of transistor 20 is coupled to the ground potential via a resistive path (not shown), a positive voltage is applied to the gate node (WL or word line) of transistor 20, and a positive voltage is applied to the drain node (BL or bit line) of transistor 20.

As mentioned above, MTJ 10 can also be switched from a parallel state to an anti-parallel state so as to store a "1". Assuming that MTJ 10 is initially in a logic "0" or P state, to store a "1", under the normal operating mode, a current at least as great or greater than the critical current $I_c$ is caused to flow through transistor 20 in the direction of arrow 35. To achieve this, node SL is supplied with a positive voltage via a resistive path (not shown), node WL is supplied with a positive voltage, and node BL is coupled to the ground potential via a resistive path (not shown).

Figure 4:
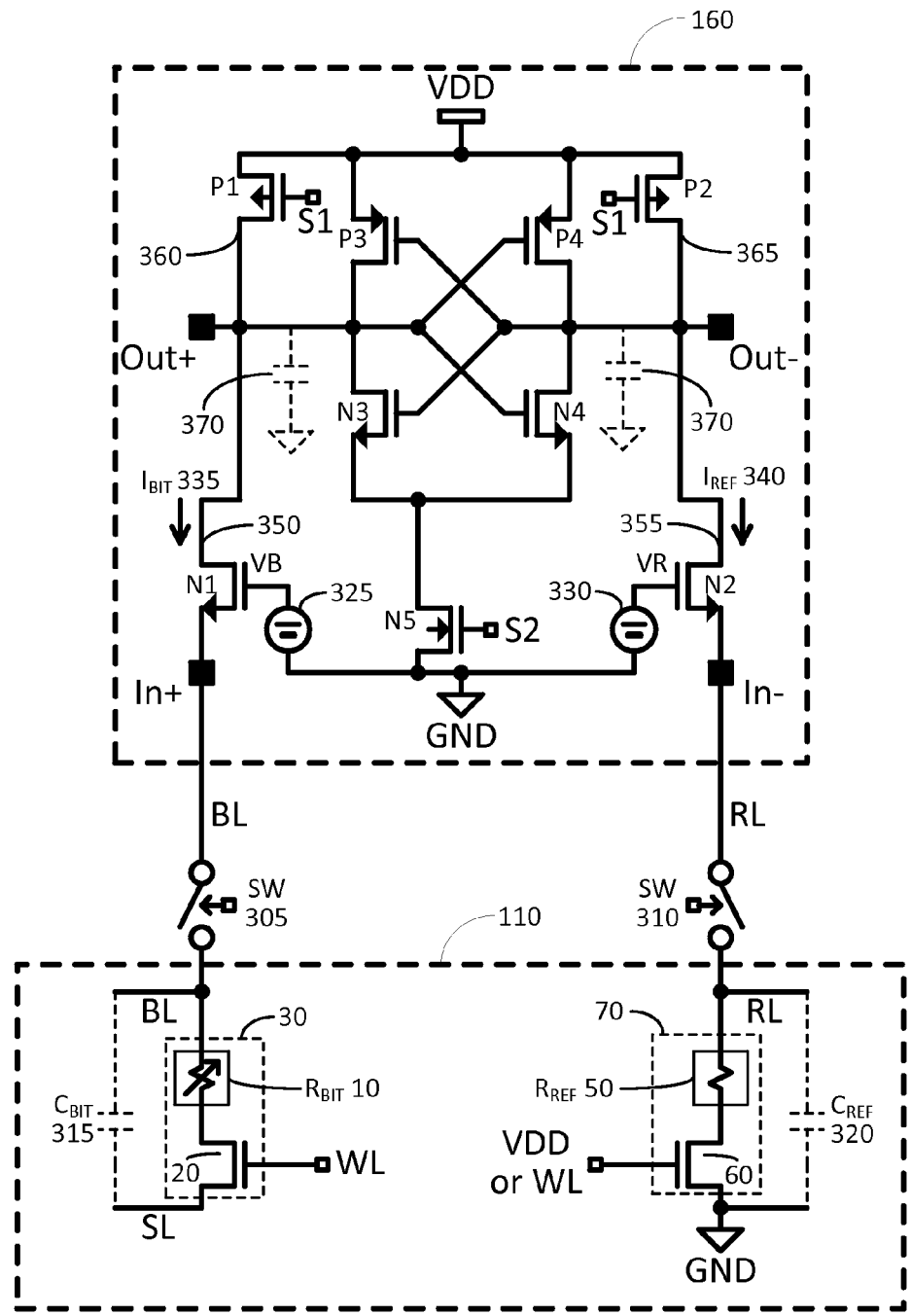
FIG. 4 is an example circuit diagram of a current sense amplifier of FIG. 2 associated with memory cells of the memory device of FIG. 2, in accordance with one embodiment of the inventive concept.

FIG. 4 is an example circuit diagram of the current sense amplifier 160 of FIG. 2 associated with memory cells (e.g., 30) of the memory device 105 of FIG. 2, in accordance with one embodiment of the inventive concept. It will be understood that while a single memory cell 30 is shown, any suitable number of memory cells can be coupled to or otherwise associated with the current sense amplifier 160.

Embodiments of the inventive concept include a current sense amplifier circuit for resistive type memories, which provides fast response times, strong noise immunity, low voltage operation, larger voltage headroom, and fewer sense errors.

The current sense amplifier circuit 160 includes a first differential output terminal Out+ configured to output a first output signal and a second differential output terminal Out- configured to output a second output signal opposite the first output signal. The output signals correspond to either a logical value "0" or a logical value "1" depending on the bit data stored in the memory cell 30.

A first input terminal In+ is coupled to a bit line BL associated with the resistive type memory cell 30. A second input terminal In- is coupled to a reference line RL associated with a reference memory cell 70. The reference memory cell 70 is similar in structure to the memory cell 30, but is used as a reference when determining whether the memory cell 30 stores a logical value "0" (e.g., when $R_{BIT}$ is equal to $R_L$) or logical value "1" (e.g., when $R_{BIT}$ is equal to $R_H$). For example, the reference memory cell 70 can include a resistor 50 ($R_{REF}$) and an associated select transistor 60. The gate terminal of the select transistor 20 of the memory cell 30 is coupled to a corresponding word line WL. The gate terminal of the select transistor 60 of the reference memory cell 70 is coupled to either a power supply (e.g., VDD) or a corresponding word line WL.

The resistor 50 ($R_{REF}$) can be designed to have a certain resistance. For example, the resistor 50 ($R_{REF}$) can have an intermediate resistance between the high resistance $R_H$ and the low resistance $R_L$ of the $R_{BIT}$ resistor. In one example embodiment, the $R_{REF}$ resistor has a resistance of $2/(1/R_H+1/R_L)$. Where the $R_{REF}$ resistor is designed to have the resistance of $2/(1/R_H+1/R_L)$, voltage VB generated by voltage generator 325 is equal to or substantially equal to voltage VR generated by voltage generator 330.

In another example embodiment, the $R_{REF}$ resistor has a resistance of either $R_H$ or $R_L$. Where the $R_{REF}$ resistor is configured to have the resistance of $R_H$, the reference line current $I_{REF}$ 340 can be modulated or otherwise adjusted by the voltage VR generated by the voltage generator 330, which is applied to the gate terminal of current modulating transistor N2. At the same time, the bit line current $I_{BIT}$ 335 can be modulated or otherwise adjusted by the voltage VB generated by the voltage generator 325, which is applied to the gate terminal of current modulating transistor N1. In this embodiment, VR is greater than VB.

Where the $R_{REF}$ resistor is configured to have the resistance of $R_L$, the reference line current $I_{REF}$ 340 can be modulated or otherwise adjusted by the voltage VR generated by the voltage generator 330, which is applied to the gate terminal of current modulating transistor N2. At the same time, the bit line current $I_{BIT}$ 335 can be modulated or otherwise adjusted by the voltage VB generated by the voltage generator 325, which is applied to the gate terminal of current modulating transistor N1. In this embodiment, VB is greater than VR.

To facilitate the explanation of the operation of the current sense amplifier 160, the $R_{REF}$ resistor will be assumed to have a resistance of $2/(1/R_H+1/R_L)$ and it will also be assumed that voltage VB is equal to or substantially equal to voltage VR.

Due to the memory cell circuitry and associated conductive lines, a bit line capacitor $C_{BIT}$ 315 exists between the bit line BL and the source line SL. Similarly, a reference line capacitor $C_{REF}$ 320 exists between the reference line RL and a ground level voltage. The bit line capacitor 315 and the reference line capacitor 320 are pre-charged during a pre-charge phase of the current sense amplifier circuit 160, as further described in detail below. Switches 305 and 310 are configured to connect or disconnect the sense amplifier circuit 160 to or from the memory cells of the memory cell array 110.

The current sense amplifier operates in three primary stages: A) a "ready" or "pre-charge" stage, B) a "set" or "amplification" stage, and C) a "go" or "latch" stage. The various operating stages will be discussed in further detail below.

The current sense amplifier circuit includes a first pre-charge transistor P1 coupled to a power supply (e.g., VDD) and to the first differential output terminal Out+. The first pre-charge transistor P1 is configured to pre-charge the bit line BL associated with the resistive type memory cell 30. The current sense amplifier circuit also includes a second pre-charge transistor P2 coupled to the power supply VDD and to the second differential output terminal Out−. The second pre-charge transistor P2 is configured to pre-charge the reference line RL associated with the reference memory cell 70.

During the "ready" or "pre-charge" stage of operation, the pre-charge transistors P1 and P2 each receives a pre-charge control signal S1 at its gate. The pre-charge control signal S1 can be generated by the control logic 190 (of FIG. 2). The pre-charge transistor P1 pre-charges the bit line BL and the bit line capacitor 315 associated with the memory cell 30 during the "ready" or "pre-charge" stage of the current sense amplifier circuit responsive to the pre-charge control signal S1. Similarly, the pre-charge transistor P2 receives the pre-charge control signal S1 and pre-charges the reference line and reference line capacitor 320 associated with the reference memory cell 70 during the "ready" or "pre-charge" stage of the current sense amplifier circuit responsive to the pre-charge control signal S1.

Currents $I_{BIT}$ 335 and $I_{REF}$ 340 generated by the pre-charge transistors provide high peak currents, which quickly pre-charge the bit line capacitor 315 and the reference line capacitor 320 because of the limited components located between the pre-charge transistor P1 and the bit line capacitor 315, and between the pre-charge transistor P2 and the reference line capacitor 320. In other words, currents generated by the pre-charge transistors do not flow through any latch circuitry of the current sense amplifier circuit, as further explained below. Therefore, fewer transistors, capacitors, and conductive lines need to be charged during the "ready" or "pre-charge" stage, and as a result, read response times are improved. The $I_{BIT}$ 335 and $I_{REF}$ 340 currents can stabilize more quickly because of the higher peak current during the pre-charge stage. In addition, irrespective of differences or mismatches between $C_{BIT}$ 315 and $C_{REF}$ 320 capacitances, sensing errors are reduced because of the fast charging during the "ready" or "pre-charge" stage. As a result, sense currents can be stabilized in as little as a few nanoseconds, e.g., ~4 nanoseconds or thereabout.

During the "set" or "amplification" stage of operation, the current sense amplifier senses bit data stored in the memory cell 30. The current sense amplifier includes a first current modulating transistor N1 that is coupled directly to the first differential output terminal Out+ and to the first pre-charge transistor P1. The first current modulating transistor N1 is configured to operate in a saturation region mode during at least the "set" or "amplification" stage of the current sense amplifier circuit, as further described in detail below. In addition, a second current modulating transistor N2 is coupled directly to the second differential output terminal Out− and to the second pre-charge transistor P2. The second current modulating transistor N2 is configured to operate in the saturation region mode during at least the "set" or "amplification" stage of the current sense amplifier circuit, as also described in detail below. The current modulation transistors N1 and N2 can be used to reduce the likelihood that a destructive write of the memory cell 30 will occur while attempting to read bit data from the memory cell 30.

More specifically, the drain terminal 350 of the first current modulating transistor N1 is directly coupled to the first differential output terminal Out+ and to the drain terminal 360 of the first pre-charge transistor P1. The source terminal 352 of the first current modulating transistor N1 is coupled to the bit line BL associated with the memory cell 30. The drain terminal 355 of the second current modulating transistor N2 is directly coupled to the second differential output terminal Out− and to the drain terminal 365 of the second pre-charge transistor. Also, the source terminal 357 of the second current modulating transistor N2 is coupled to the reference line RL associated with the reference memory cell 70. The transistors N1 and N2 are preferably NMOS type transistors. The transistors P1 and P2 are preferably enhancement mode PMOS loading type transistors, i.e., digital mode on/off type transistors. It will be understood that other types of MOS transistors can be used without departing from the inventive concepts disclosed herein.

The first and second current modulating transistors N1 and N2 are configured to continuously average the bit line current $I_{BIT}$ 335 and the reference line current $I_{REF}$ 340, respectively, during the "set" or "amplification stage" of the current sense amplifier 160. Continuously averaging the bit line current and the reference line current can include, for example, operating the first current modulating transistor N1 in a saturation region mode and the second current modulating transistor N2 in a saturation region mode during at least the "set" or "amplification" stage of the current sense amplifier circuit 160, without killing the smaller currents (i.e., $I_{BIT}$ 335 and $I_{REF}$ 340) that flow on the bit line BL and the reference line RL during the "set" or "amplification" stage of operation. Parasitic capacitances illustrated as dashed-line grounded capacitors 370 also contribute to the averaging of the bit line and reference line currents. As a result, noise immunity is strengthened and spikes of noise, switching noise, or other electromagnetic interference is less likely to cause disruption to the signals that are processed or output by the current sense amplifier circuit 160.

The first and second current modulating transistors N1 and N2 are able to operate in the saturation region rather than a triode or linear region during such "set" or "amplification" operation stage because the structure of the current sense amplifier 160 provides sufficient voltage headroom to do so. As previously mentioned, low power supply voltages can cause voltage headroom problems in conventional sense amplifier circuitry because of multiple stacked transistors. In the embodiments of the present inventive concept, the current modulating transistor N1 is directly coupled to the pre-charge transistor P1, thereby forming a stack of only two transistors in the path between the power supply VDD and the memory cell 30. Similarly, the current modulating transistor N2 is directly coupled to the pre-charge transistor P2, thereby forming a stack of only two transistors in the path between the power supply VDD and the reference memory cell 70.

Thus, even in the case of low power supply voltages on the order of 1.2 V or 1.3 V, there is sufficient headroom for the transistors N1 and N2 to operate in the saturation region while sensing bit data stored in the memory cell 30. Thus, lower voltage operation is made possible, or in other words, power supply voltages can be reduced without adversely affecting the operation of the current sense amplifier circuit, particularly during the "set" or "amplification" stage of operation. Higher noise immunity and better reliability of the logical output signals are some of the advantages that result from this example configuration.

During the "go" or "latch" stage of operation, the current sense amplifier latches a logical value "0" or logical value "1" at the first or second differential output terminals (e.g., Out+, Out−) of the current sense amplifier 160, as further described in detail below. The current sense amplifier circuit 160 includes a cross-coupled latch circuit, which includes latch transistors P3, P4, N3, and N4. The cross-coupled latch circuit is connected to the first and second differential output terminals Out+ and Out−.

The cross-coupled latch circuit optionally includes a latch enable transistor N5. Alternatively, the latch enable transistor N5 can be global to each of plurality of current sense amplifier circuits (e.g., 160 and 165 of FIG. 2). In other words, a single global latch enable transistor N5 can be used to enable each of the latch circuits of each of the current sense amplifier circuits in the memory device 150.

The latch enable transistor N5 is configured to enable the "go" or "latch" stage of the current sense amplifier circuit 160 responsive to a latch control signal S2. In some embodiments, the latch control signal S2 is generated by the control logic 190 (of FIG. 2). The first latch transistor P3 is coupled to the power supply (e.g., VDD) and to the first differential output terminal Out+. The second latch transistor P4 is coupled to the power supply (e.g., VDD) and to the second differential output terminal Out−. The third latch transistor N3 is coupled to the first latch transistor P3 and to the latch enable transistor N5. The fourth latch transistor N4 is coupled to the second latch transistor P4 and to the latch enable transistor N5. The latch transistors are configured to latch, based on positive feedback, a logical value "0" or logical value "1" at the first or second differential output terminals Out+ or Out−, respectively, depending on a bit value stored in the resistive type memory cell 30, and responsive to the latch enable transistor N5 being turned on by the latch control signal S2 during the "go" or "latch" stage of operation.

More specifically, the source terminal of the third latch transistor N3 is directly coupled to the drain terminal of the latch enable transistor N5. Similarly, the source terminal of the fourth latch transistor N4 is directly coupled to the drain terminal of the latch enable transistor N5. The gate terminal of the first latch transistor P3 is coupled to the second differential output terminal Out−. The gate terminal of the second latch transistor P4 is coupled to the first differential output terminal Out+. The gate terminal of the third latch transistor N3 is coupled to the second differential output terminal Out−. And the gate terminal of the fourth latch transistor N4 is coupled to the first differential output terminal Out+.

The drain terminal of each of the first and third latch transistors (i.e., P3 and N3) is coupled to the first differential output terminal Out+. The drain terminal of each of the second and fourth latch transistors (i.e., P4 and N4) is coupled to the second differential output terminal Out−. The latch enable transistor N5 is preferably an enhancement mode NMOS loading type transistor, i.e., digital mode on/off type transistor. The first and second latch transistors P3 and P4 are preferably each a PMOS type transistor. The third and fourth latch transistors N3 and N4 are preferably each an NMOS type transistor. It will be understood that other types of MOS transistors can be used without departing from the inventive concepts disclosed herein.

Figure 5:
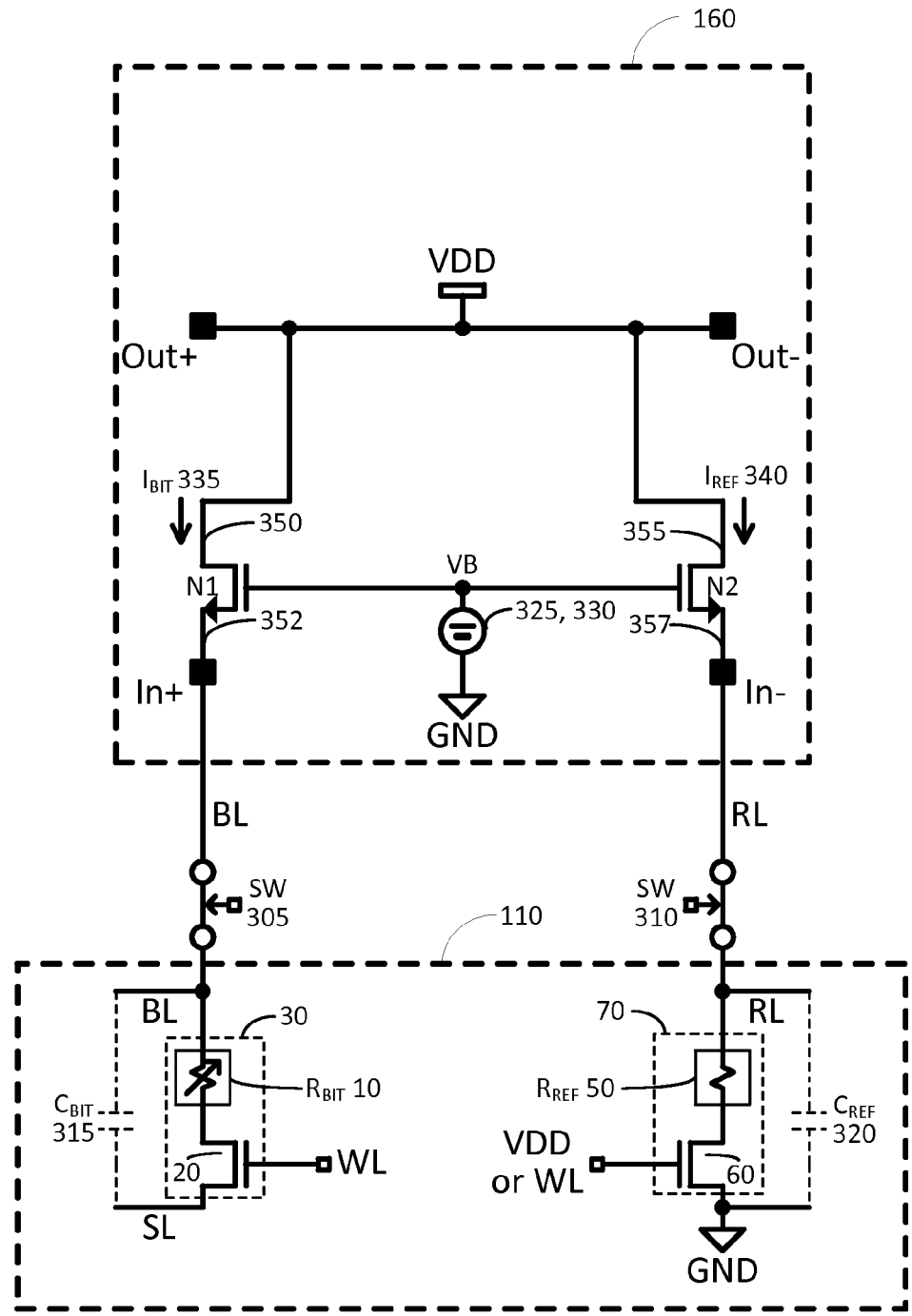
FIG. 5 is an example equivalent circuit diagram of the current sense amplifier circuit of FIG. 4 associated with a "ready" or "pre-charge" stage of operation.

FIG. 5 is an example equivalent circuit diagram of the current sense amplifier circuit 160 of FIG. 4 associated with the "ready" or "pre-charge" stage 405 of operation. The switches SW 305 and SW 310 are assumed to be closed, thereby connecting the current sense amplifier circuit 160 to the memory cell 30 and the reference memory cell 70. In the "ready" or "pre-charge" stage of the current sense amplifier circuit 160, the word line WL transitions to a high ("H") state, the pre-charge control signal 51 is in a low ("L") state, and the latch enable signal S2 is in a "L" state. The first pre-charge transistor P1 and the second pre-charge transistor P2 are thus fully turned on responsive to the pre-charge control signal 51 and form a conductive path to the power supply VDD. Therefore, the locations of the pre-charge transistors P1 and P2 are shown as conductive paths in the equivalent circuit diagram of FIG. 5.

The current modulating transistors N1 and N2 are also turned on responsive to the gate voltage VB. As a result, the first pre-charge transistor P1 and the second pre-charge transistor P2 pre-charge the bit line BL and the reference line RL, respectively. In addition, the bit line capacitor 315 and the reference line capacitor 320 are pre-charged by the $I_{BIT}$ current 335 and the $I_{REF}$ current 340. The latch circuit is not enabled because the differential output terminals are at or near the power supply voltage VDD, which turns off the latch transistors P3 and P4. Furthermore, while the latch transistors N3 and N4 are in an on state because Out+ and Out− are at a high level, the latch transistors N3 and N4 do not operate because the latch enable transistor N5 is turned off. Therefore, the pre-charge currents do not flow through any transistor of the latch circuit, thereby improving peak current levels during the pre-charge stage, and improving response times.

Figure 6:
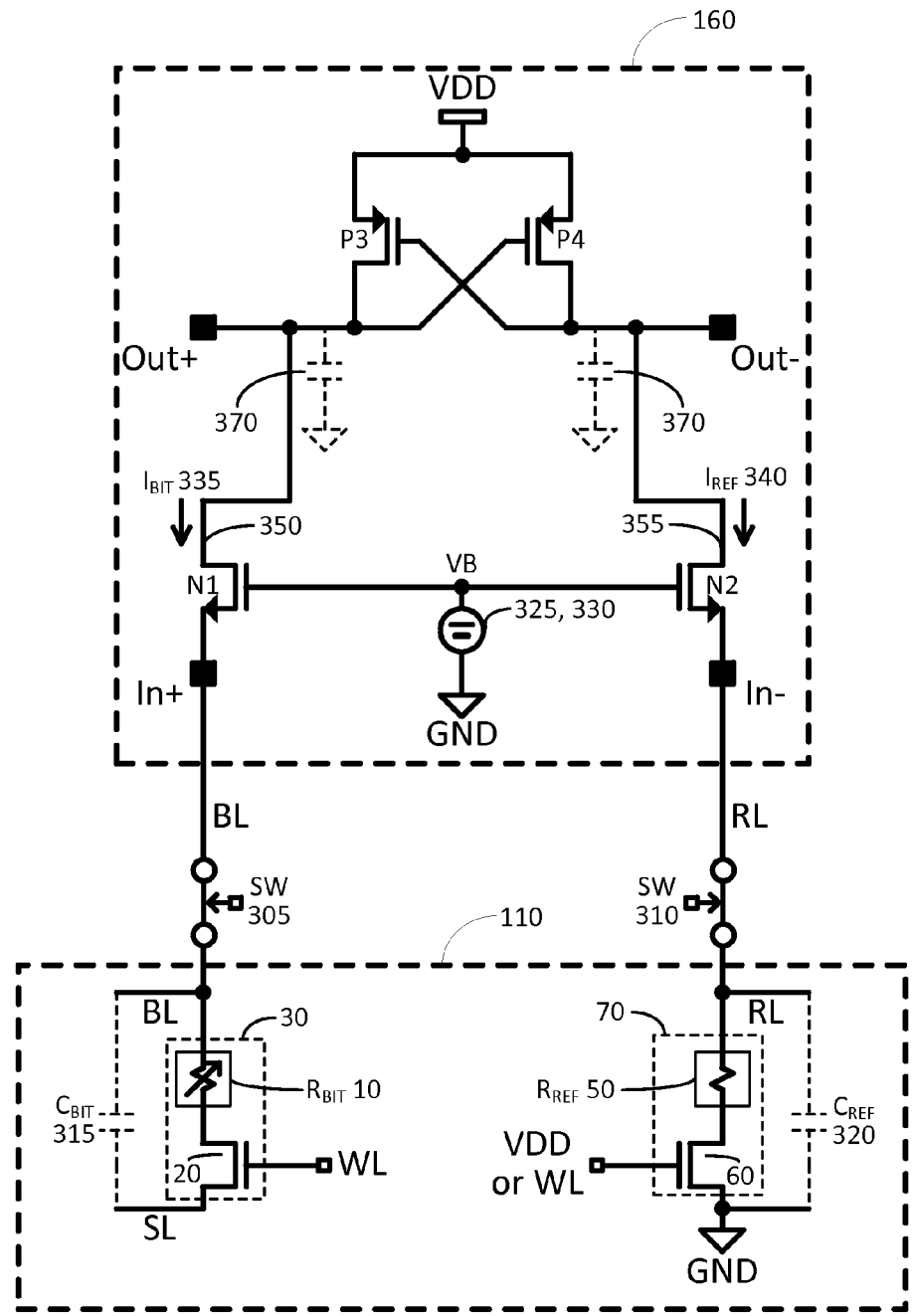
FIG. 6 is an example equivalent circuit diagram of the current sense amplifier circuit of FIG. 4 associated with a "set" or "amplification" stage of operation.

FIG. 6 is an example equivalent circuit diagram of the current sense amplifier circuit 160 of FIG. 4 associated with the "set" or "amplification" stage 505 of operation. The switches SW 305 and SW 310 are assumed to be closed, thereby connecting the current sense amplifier circuit 160 to the memory cell 30 and the reference memory cell 70. In the "set" or "amplification" stage of the current sense amplifier circuit 160, the word line WL remains at the "H" state, the pre-charge control signal S1 transitions to the "H" state, and the latch enable signal S2 remains in the "L" state. The first pre-charge transistor P1 and the second pre-charge transistor P2 are thus turned off responsive to the pre-charge control signal S1, and are therefore removed from the equivalent circuit diagram of FIG. 6. In addition, the latch transistors N3 and N4 do not operate because the latch enable transistor N5 is still off at this stage.

During the "set" or "amplification" stage 505, the latch transistors P3 and P4 are initially off due to parasitic capacitance 370, but begin to turn on due to the $I_{BIT}$ 335 current and the reference line current $I_{REF}$ 340 pulling the differential output terminals Out+ and Out− lower. However, the latch transistors P3 and P4 do not turn on at the same rate. Due to a difference between the $I_{BIT}$ 335 current and the $I_{REF}$ 340 current (i.e., due to the difference between the resistances of the memory cell and the reference memory cell), the latch transistors P3 and P4 turn on at different rates. Based on positive feedback, one of the latch transistors P3 or P4 will continue to turn on and the other will begin to turn off. By way of an example, if the latch transistor P3 turns on faster than the latch transistor P4, the latch transistor P3 will pass the power supply voltage VDD to a corresponding differential output terminal Out+, which will cause the other latch transistor P4 to turn off.

Moreover, during the "set" or "amplification" stage 505, the current modulating transistors N1 and N2 operate in the saturation region rather than the triode or linear region, and together with the parasitic capacitance 370, continuously average the bit line current $I_{BIT}$ 335 and the reference line current $I_{REF}$ 340, thereby improving noise immunity.

Figure 7:
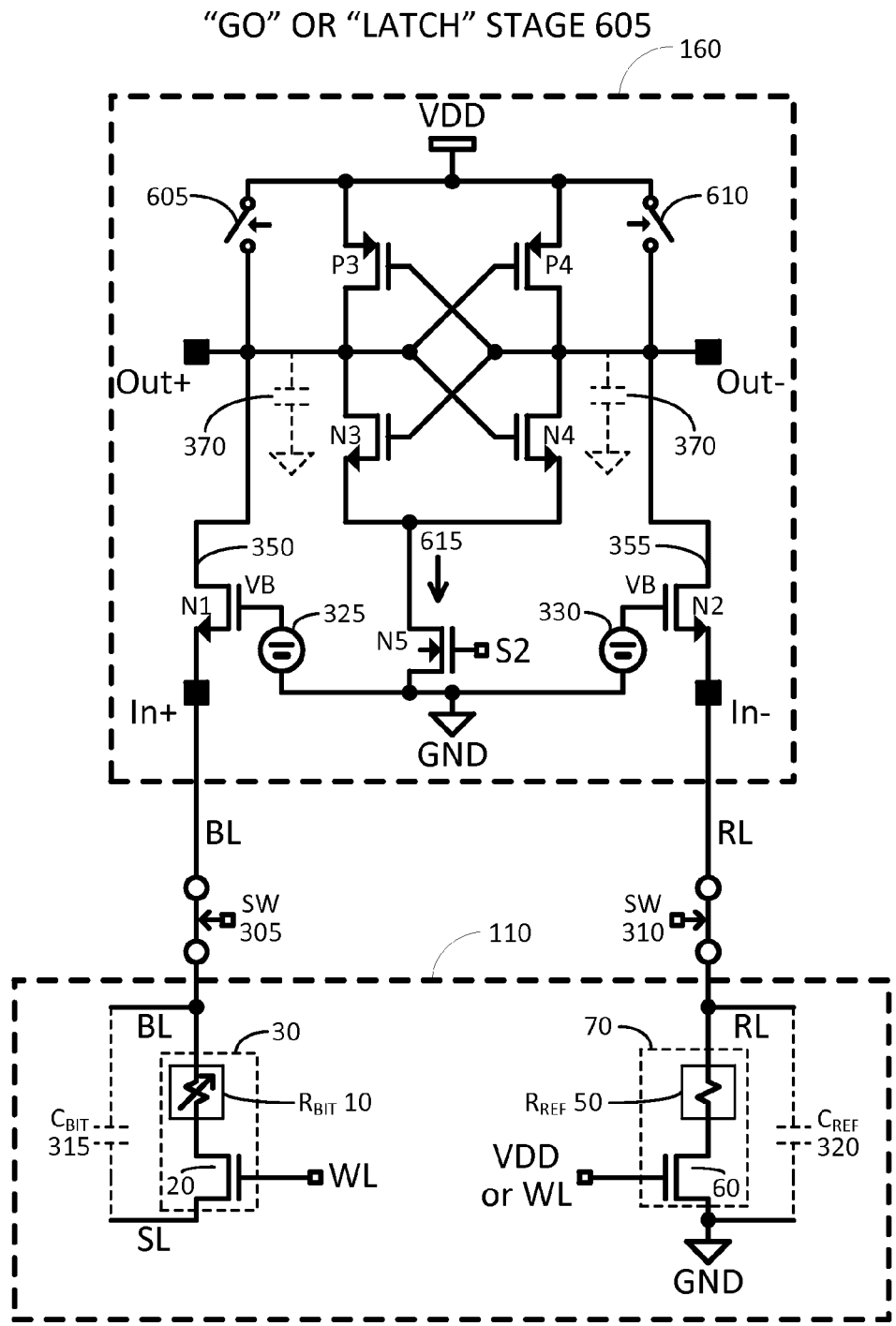
FIG. 7 is an example equivalent circuit diagram of the current sense amplifier circuit of FIG. 4 associated with a "go" or "latch" stage of operation.

FIG. 7 is an example equivalent circuit diagram of the current sense amplifier circuit of FIG. 4 associated with the "go" or "latch" stage 605. The switches SW 305 and SW 310 are assumed to be closed, thereby connecting the current sense amplifier circuit 160 to the memory cell 30 and the reference memory cell 70. In the "go" or "latch" stage of the current sense amplifier circuit 160, the word line WL transitions to the "L" state, the pre-charge control signal S1 remains at the "H" state, and the latch enable signal S2 transitions to the "H" state. The first pre-charge transistor P1 and the second pre-charge transistor P2 remain turned off and are represented in FIG. 7 as open switches 605 and 610. The latch enable transistor N5 and the latch transistors N3 and N4 are now able to operate responsive to the latch enable control signal S2, thereby causing latch current 615 to flow.

The full latch circuit (i.e., latch transistors P3, P4, N3, and N4) is used to latch a logical value "0" or logical value "1" at the differential output terminals based on positive feedback. Continuing with the example above, the latch transistor P3 can be turned on, the latch transistor P4 can be turned off, the latch transistor N3 can be turned off, and the latch transistor N4 can be turned on, based on positive feedback.

It will be understood that the latch circuit will operate differently depending on whether a logical value "0" or "1" is stored in the memory cell 30. For example, if the memory cell is in a $R_L$ state (i.e., logical value "0"), then $I_{BIT}$ 335 is greater than $I_{REF}$ 340, which causes P4 to be turned on faster than P3. Thus, in such case, the latch transistor P3 is turned off, the latch transistor P4 is turned on, the latch transistor N3 is turned on, and the latch transistor N4 is turned off, based on positive feedback, thereby latching a logical value "0" at the differential output terminal Out+. Conversely, if the memory cell is in a $R_H$ state (i.e., logical value "1"), then $I_{BIT}$ 335 is less than $I_{REF}$ 340, which causes P3 to be turned on faster than P4. Thus, in such case, the latch transistor P3 is turned on, the latch transistor P4 is turned off, the latch transistor N3 is turned off, and the latch transistor N4 is turned on, based on positive feedback, thereby latching a logical value "1" at the differential output terminal Out+.

FIG. 8 is an example waveform diagram showing waveforms associated with different stages of the sense amplifier circuit 160 of FIG. 4 when a memory cell resistance $R_{BIT}$ is previously set to the "H" value $R_H$, in accordance with some embodiments of the inventive concept.

In the "ready" or "pre-charge" stage 405 of the current sense amplifier circuit 160, the word line WL transitions to a high ("H") state, the pre-charge control signal S1 is in a low ("L") state, and the latch enable signal S2 is in a "L" state. The peak 705 of the $I_{BIT}$ 335 current of the embodiments of the present inventive concept is higher than the peak of the bit line current of the prior art. Therefore, the bit lines and bit line capacitance are more quickly charged during the "ready" or "pre-charge" stage of operation. In addition, irrespective of differences or mis-matches between $C_{BIT}$ 315 and $C_{REF}$ 320 capacitances, sensing errors are reduced because of the fast charging during the "ready" or "pre-charge" stage.

In the "set" or "amplification" stage 505 of the current sense amplifier circuit 160, the word line WL remains at the "H" state, the pre-charge control signal S1 transitions to the "H" state, and the latch enable signal S2 remains in the "L" state. While the bit line current of the prior art can be killed during this stage, i.e., sent to zero because of voltage headroom problems, the $I_{BIT}$ 335 current of the embodiments of the present inventive concept remains stable because of sufficient voltage headroom, as explained above, and is continuously averaged, thereby providing improved noise immunity, better amplification properties, and efficient operation of the current sense amplifier circuit 160. The reference line current of the prior art is also less stable than the $I_{REF}$ current 340.

In the "go" or "latch" stage 605 of the current sense amplifier circuit 160, the word line WL transitions to the "L" state, the pre-charge control signal S1 remains at the "H" state, and the latch enable signal S2 transitions to the "H" state. Because $R_{BIT}=R_H$ in this example, a logical value "1" is latched at the differential output terminal Out+.

FIG. 9 is an example waveform diagram showing waveforms associated with different stages of the sense amplifier circuit of FIG. 4 when a memory cell resistance $R_{BIT}$ is previously set to the "L" value $R_L$, in accordance with some embodiments of the inventive concept.

In the "ready" or "pre-charge" stage 405 of the current sense amplifier circuit 160, the word line WL transitions to a high ("H") state, the pre-charge control signal S1 is in a low ("L") state, and the latch enable signal S2 is in a "L" state. The peak 805 of the $I_{BIT}$ 335 current of the embodiments of the present inventive concept is higher than the peak of the bit line current of the prior art. Therefore, the bit lines and bit line capacitance are more quickly charged during the "ready" or "pre-charge" stage of operation. In addition, irrespective of differences or mis-matches between $C_{BIT}$ 315 and $C_{REF}$ 320 capacitances, sensing errors are reduced because of the fast charging during the "ready" or "pre-charge" stage.

In the "set" or "amplification" stage 505 of the current sense amplifier circuit 160, the word line WL remains at the "H" state, the pre-charge control signal S1 transitions to the "H" state, and the latch enable signal S2 remains in the "L" state. While the bit line current of the prior art can be killed during this stage, i.e., sent to zero because of voltage headroom problems, the $I_{BIT}$ 335 current of the embodiments of the present inventive concept remains stable because of sufficient voltage headroom, as explained above, and is continuously averaged, thereby providing improved noise immunity, better amplification properties, and efficient operation of the current sense amplifier circuit 160. As mentioned above, the reference line current of the prior art is also less stable than the $I_{REF}$ current 340.

In the "go" or "latch" stage 605 of the current sense amplifier circuit 160, the word line WL transitions to the "L" state, the pre-charge control signal S1 remains at the "H" state, and the latch enable signal S2 transitions to the "H" state. Because $R_{BIT}=R_L$ in this example, a logical value "0" is latched at the differential output terminal Out+.

Figure 10:
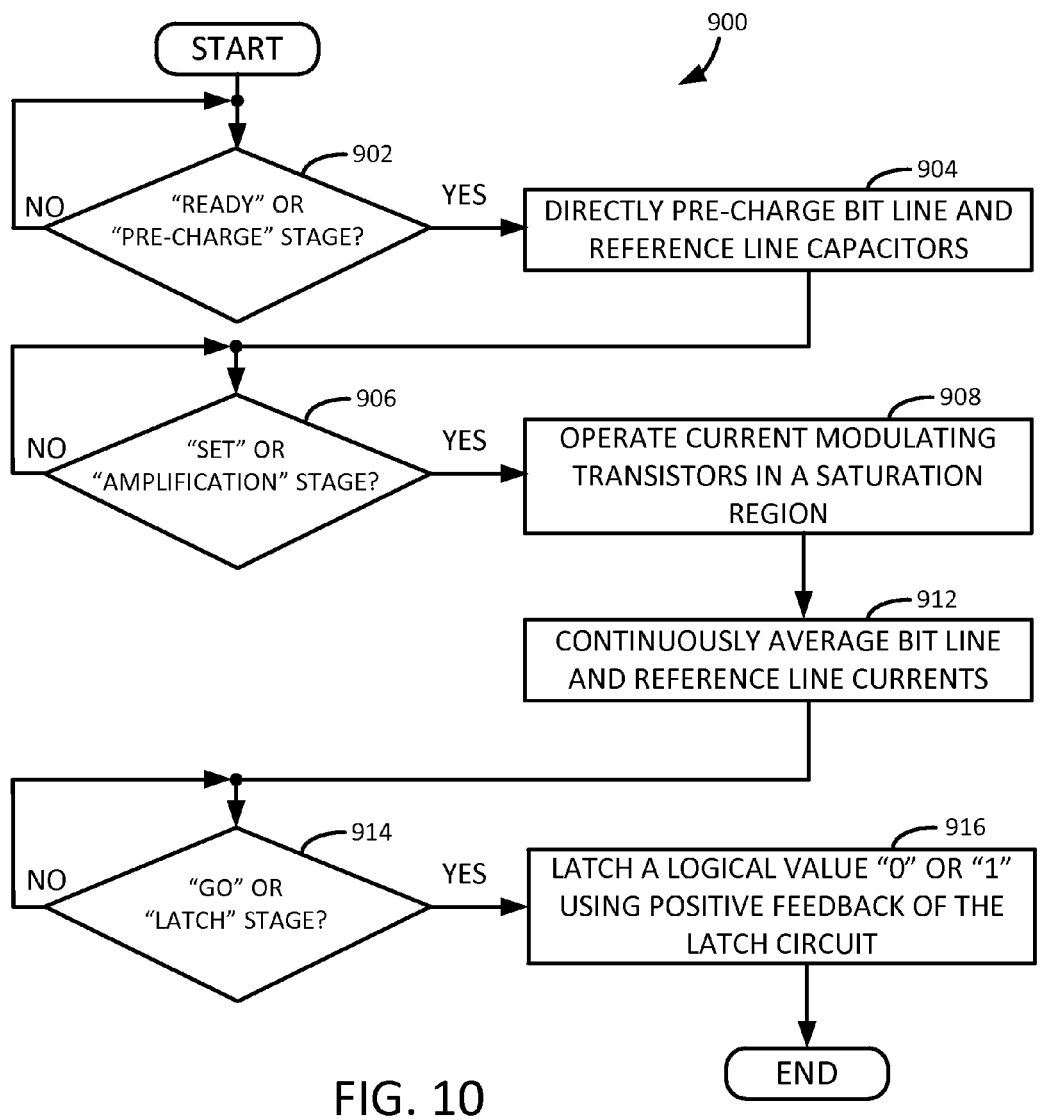
FIG. 10 is a flow diagram showing a technique for sensing data in a resistive type memory using a current sense amplifier circuit, in accordance with some embodiments of the inventive concept.

FIG. 10 is a flow diagram 900 showing a technique for sensing data in the resistive type memory 30 using the current sense amplifier circuit 160, in accordance with some embodiments of the inventive concept. The technique begins at 902, where a determination is made whether to enter the "ready" or "pre-charge" stage 405. If YES, the flow proceeds to 904 where the bit line and reference line capacitors are directly pre-charged, as described in detail above. Otherwise, if NO, the flow returns to the start.

At 906, another determination is made whether to enter the "set" or "amplification" stage 505. If YES, the flow proceeds to 908, and the current modulating transistors (e.g., N1 and N2) are operated in a saturation region during the "set" or "amplification" stage, and the bit line and reference line currents are continuously averaged at 912, as described in detail above, thereby improving noise immunity during this stage. Otherwise, if NO, the flow returns to the start for further determinations and sense amplifier operations. The flow may repeat the stage 906.

Another determination is made at 914 whether to enter the "go" or "latch" stage of operation. If YES, the flow proceeds to 916, where a logical value of "0" or "1" is latched using positive feedback of the latch circuit, as also described in detail above. Otherwise, if NO, the flow may repeat the stage 914 or perform other determinations and current sense amplifier operations.

Figure 11:
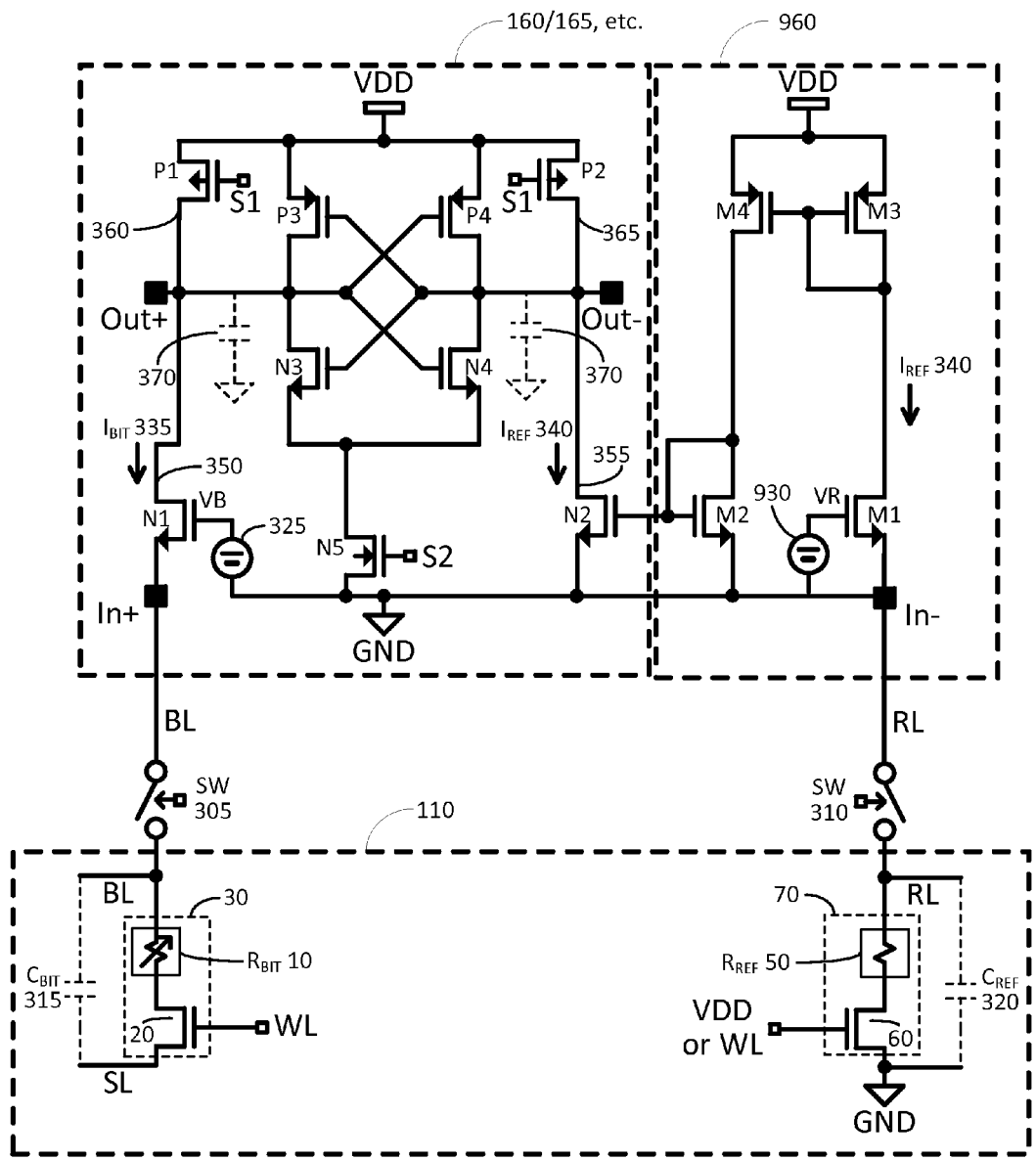
FIG. 11 is an example circuit diagram of a current sense amplifier of FIG. 2 associated with a current mirror, in accordance with another embodiment of the inventive concept.

FIG. 11 is an example circuit diagram of the current sense amplifier (e.g., 160 and 165) of FIG. 2 associated with a current mirror 960, in accordance with another embodiment of the inventive concept. As previously mentioned, the current sense amplifier circuitry 150 (of FIG. 2) may include multiple current sense amplifier circuits. Each current sense amplifier circuit can be associated with a corresponding bit line of one of the memory blocks (e.g., 120 and 130 of FIG. 2). The current mirror circuit 960 is coupled to the multiple current sense amplifiers (e.g., 160, 165, etc.).

Each of the current sense amplifier circuits (e.g., 160, 165, etc.) includes a latch circuit (e.g., P3, P4, N3, and N4) as described in detail above. The memory device 105 further includes a global latch enable transistor N5 configured to enable a latch stage for each of the current sense amplifier circuits responsive to the latch control signal S2.

The current mirror circuit 960 includes current mirror transistors M1, M2, M3, and M4. The gate of the current modulating transistor N2 is coupled to the gate of the mirror transistor M2. The voltage source 935 provides gate voltage VR to the gate of the mirror transistor M1. The mirror transistors are operable to mirror the $I_{REF}$ 340 current for each of the multiple current sense amplifier circuits.

The current mirror circuit 960 is coupled to a reference line RL associated with the reference memory cell 70. The current mirror circuit 960 pre-charges the reference line RL associated with the reference memory cell 70 during a pre-charge stage of each of the current sense amplifier circuits. The current mirror circuit 960 mirrors the reference line current $I_{REF}$ 340 during at least an amplification stage of each of the current sense amplifier circuits. In addition, the current mirror circuit 960 is configured to pre-charge the reference line RL associated with the reference memory cell 70. Moreover, the current mirror circuit 960 is configured to continuously average the reference line current $I_{REF}$ 340 during the "set" or "amplification" stage of operation.

Figure 12:
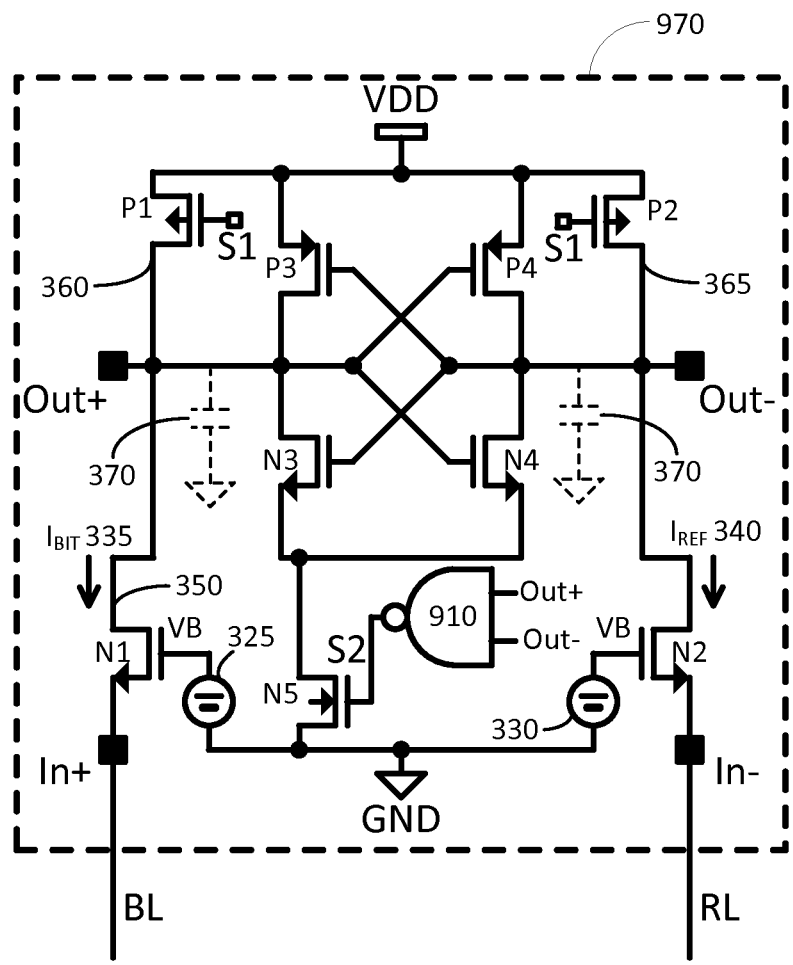
FIG. 12 is an example circuit diagram of a current sense amplifier including self-latching logic, in accordance with yet another embodiment of the inventive concept.

FIG. 12 is an example circuit diagram of a current sense amplifier circuit 970 including self-latching logic, in accordance with yet another embodiment of the inventive concept. The current sense amplifier 970 is similar to the current sense amplifier 160 of FIGS. 2 and 4, and therefore, a detailed description of the same or similar components is omitted for the sake of brevity.

The primary difference is that the current sense amplifier circuit 970 includes a logic gate 910 for providing self-latching logic. The logic gate 910 is configured to receive the first and second output signals (i.e., Out+ and Out−) as inputs, and to generate the latch control signal S2. The logic gate is preferably a NAND gate. Thus, S2 is set to the "H" state when either of the Out+ or Out− signals are in a "L" state, thereby providing the proper control signal for the "go" or "latch" stage of operation. The operation of the latch circuit is therefore controlled responsive to the latch control signal S2 generated by the logic gate 910. It will be understood that the latch enable transistor N5 can be global to each of the current sense amplifier circuits.

Figure 13A:
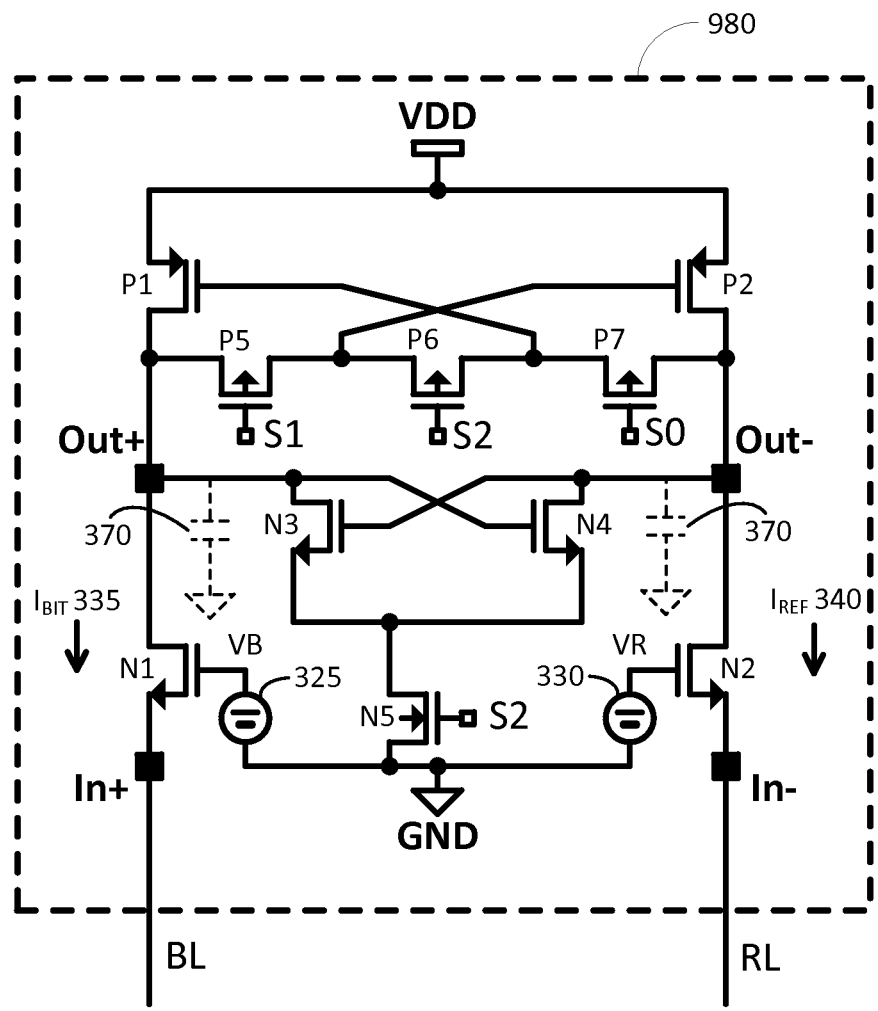
FIG. 13A is an example circuit diagram of a current sense amplifier, in accordance with still another embodiment of the inventive concept.

FIG. 13A is an example circuit diagram of a current sense amplifier 980, in accordance with still another embodiment of the inventive concept. The current sense amplifier 980 is similar to the current sense amplifier 160 of FIGS. 2 and 4, and therefore, a detailed description of the same or similar components is omitted for the sake of brevity.

The primary difference is that the current sense amplifier circuit 980 includes control transistors P5, P6, and P7. The operation of the control transistors P5, P6, and P7 is discussed below with reference to the waveform diagrams of FIGS. 13B and 13C.

Figure 13B:
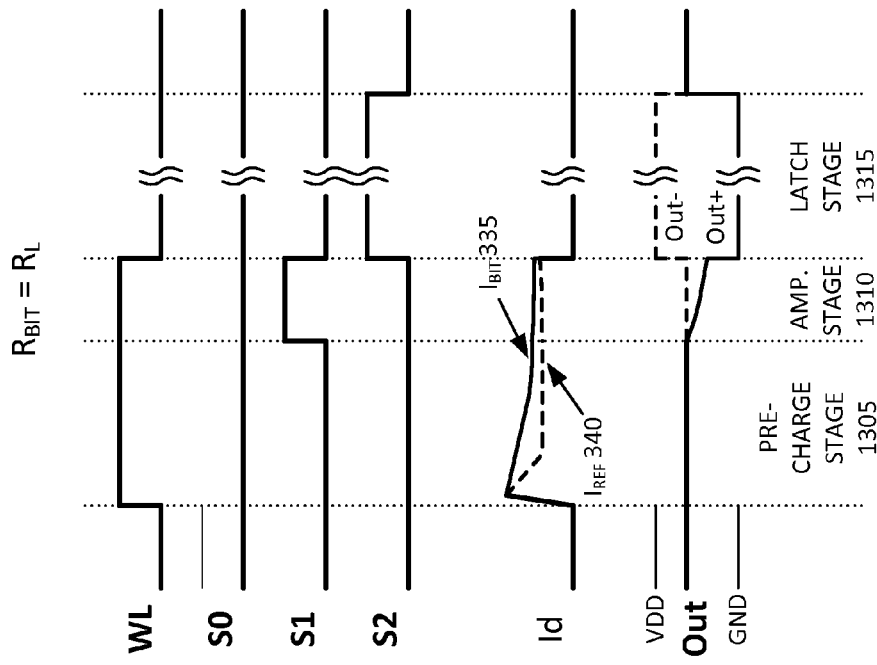
FIG. 13B is an example waveform diagram showing waveforms associated with different stages of the sense amplifier circuit of FIG. 13A when a memory cell resistance is previously set to high, in accordance with some embodiments of the inventive concept.

FIG. 13B is an example waveform diagram showing waveforms associated with different stages of the sense amplifier circuit of FIG. 13A when a memory cell resistance is previously set to high, in accordance with some embodiments of the inventive concept.

Figure 13C:
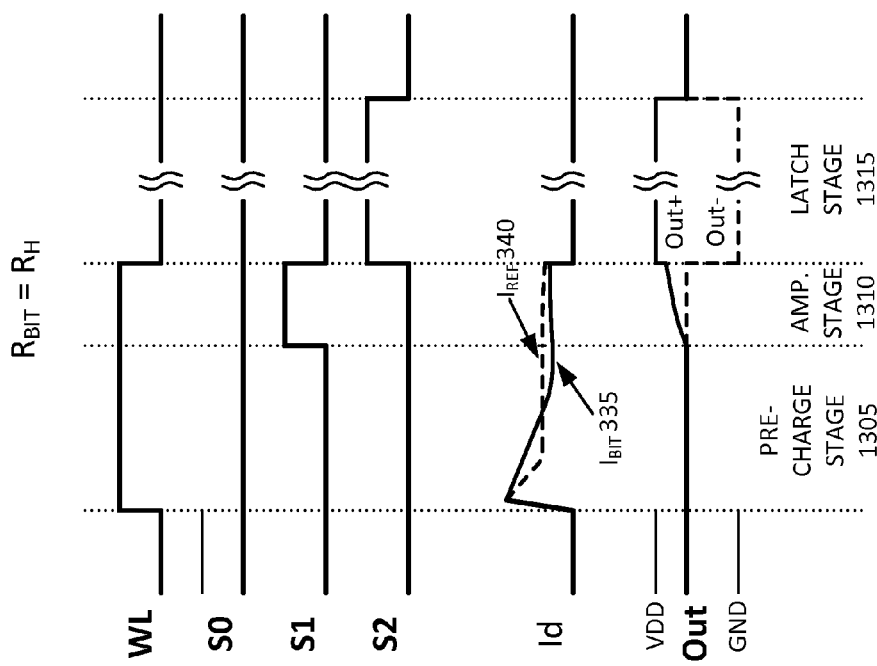
FIG. 13C is an example waveform diagram showing waveforms associated with different stages of the sense amplifier circuit of FIG. 13A when a memory cell resistance is previously set to low, in accordance with some embodiments of the inventive concept.

FIG. 13C is an example waveform diagram showing waveforms associated with different stages of the sense amplifier circuit of FIG. 13A when a memory cell resistance is previously set to low, in accordance with some embodiments of the inventive concept.

Reference is now made to FIGS. 13A, 13B, and 13C. During the "ready" or "pre-charge" stage 1305 of the current sense amplifier circuit, control signals S0, 51, and S2 are set to a "L" state, and therefore, transistors P5, P6, and P7 are turned on. In this stage, the pre-charge transistors P1 and P2 are in the configuration of a diode and are turned on. The pre-charge transistor P1 pre-charges the bit line BL and the bit line capacitor 315 associated with the memory cell 30. Similarly, the pre-charge transistor P2 pre-charges the reference line and reference line capacitor 320 associated with the reference memory cell 70. Currents $I_{BIT}$ 335 and $I_{REF}$ 340 generated by the pre-charge transistors provide high peak currents, which quickly pre-charge the bit line capacitor 315 and the reference line capacitor 320.

During the "set" or "amplification" stage 1310 of operation, the control signal S1 transitions to a "H" state while the control signals S0 and S2 remain at a "L" state, and therefore, transistor P5 is turned off. Transistors P6 and P7 remain in an on state. As a result, a current mirror circuit is formed during stage 1310. More specifically, the gates of the P1 and P2 transistors remain connected together and the drain of the P2 transistor remains connected to the gates of the P1 and P2 transistors, while the P5 transistor remains off during this stage. Thus, the P2 transistor is the current source and the P1 transistor mirrors the current of the P2 side of the current mirror. Due to the difference between the actual or controlled resistances of the memory cell 30 and the reference memory cell 70, the differential output signals Out+ and Out− will either begin to rise or begin to fall depending on whether $R_{BIT}=R_H$ (as illustrated in FIG. 13B) or $R_{BIT}=R_L$ (as illustrated in FIG. 13C).

During the "go" or "latch" stage 1315 of operation, the control signal S1 transitions to a "L" state, the control signal S2 transitions to a "H" state, and the control signal S0 remains at a "L" state. As a result, transistor P5 is turned on, transistor P6 is turned off, and transistor P7 remains on. This results in a cross-coupled latch structure, which operates substantially the same as the cross-coupled latch structure described above with reference to transistors P3, P4, N3, and N4. The difference is that here, the transistors P1 and P2 are used in place of transistors P3 and P4 during the "go" or "latch" stage 1315. Based on positive feedback, the latch transistors P1, P2, N3, and N4 will latch logical value "0" or "1" at the differential output terminals Out+ or Out− depending on the bit value stored in the memory cell 30.

Even though the transistor P7 remains on during all three stages in this example, it will be understood that the current sense amplifier can support multiple memory arrays or blocks, which can be arranged on either or both sides of the current sense amplifier. Therefore, the transistors P5 and P7 provide symmetry, and can operate accordingly based on which memory array or block is activated. The transistors P5, P6, and P7 are preferably enhancement mode PMOS loading type transistors, i.e., digital mode on/off type transistors. It will be understood that other types of MOS transistors can be used without departing from the inventive concepts disclosed herein.

FIG. 14A is an example diagram of a layout of the memory cell array (e.g., 110) and associated memory banks (e.g., 1415 and 1420) in an edge-reference cell arrangement or pattern (e.g., 1405), in accordance with another embodiment of the inventive concept. Legend 1400 provides a description of the symbols used in the arrangement. Referring to FIG. 14A, the shared current sense amplifiers 1435 are used by either or both memory banks 1415 and 1420. The reference memory cells 70 can be disposed adjacent to or near to the shared current sense amplifiers 1435. A particular reference memory cell 70 can provide a reference for multiple memory bit cells 30 in bank 1415 and/or bank 1420.

A reference memory cell 70 from memory bank 1415 and a reference cell 70 from memory bank 1420 can be coupled to a shared current sense amplifier (e.g., from among the sense amplifiers 1435) over corresponding reference lines. In other words, a shared sense amplifier can be coupled to two or more reference lines and/or reference memory cells from different banks. Similarly, a memory bit cell 30 from memory bank 1415 and a memory bit cell 30 from memory bank 1420 can be coupled to a shared current sense amplifier (e.g., from among the sense amplifiers 1435) over corresponding bit lines. In other words, a single shared sense amplifier can be coupled to two or more bit lines and/or memory bit cells from different banks.

FIG. 14B is an example diagram of a layout of the memory cell array (e.g., 110) and associated memory banks (e.g., 1425 and 1430) in a word-reference cell arrangement or pattern (e.g., 1410), in accordance with another embodiment of the inventive concept. As with FIG. 14A, legend 1400 provides a description of the symbols used in this arrangement. Referring to FIG. 14B, the shared current sense amplifiers 1440 are used by either or both memory banks 1425 and 1430. In this layout, memory bit cells 30 can be disposed between the reference memory cells 70 and the shared sense amplifiers 1440. A particular reference memory cell 70 can provide a reference for multiple memory bit cells 30 in bank 1425 and/or bank 1430.

A reference memory cell 70 from memory bank 1430 and a memory bit cell 30 from memory bank 1425 can be coupled to a shared current sense amplifier (e.g., from among the sense amplifiers 1440) over a corresponding reference line and bit line, respectively. In other words, a shared sense amplifier can be coupled to a reference line and a bit line that are associated with different banks. Similarly, a shared sense amplifier can be coupled to a reference cell 70 and a memory bit cell 30 that are associated with different banks. In other words, a single shared sense amplifier can be coupled to reference cells and/or memory bit cells from different banks.

A resistive memory device according to an embodiment of the inventive concept may be applied to various products. The resistive memory device according to an embodiment of the inventive concept may be applied to storage devices such as a memory card, an USB memory, a solid state drive (SSD), and the like, as well as to electronic devices such as a personal computer, a digital camera, a camcorder, a cellular phone, an MP3 player, a PMP, a PSP, a PDA, and the like.

Referring to FIGS. 4 through 14B described above, in some embodiments, the source lines SLs are tied to a ground GND potential, and this is the configuration that is assumed for the circuit diagram illustrated in FIGS. 4 through 14B. It will be understood, however, that in some embodiments (for any of the circuit diagrams described herein), the source lines SLs can be tied to a power supply VDD potential. In such case, each PMOS type transistor is replaced with an NMOS type transistor, and each NMOS transistor is replaced with a PMOS type transistor. In other words, where the source lines SLs are tied to the VDD potential, the sense amplifier is swapped between the upside and the downside, which means that the NMOS type transistors are replaced with PMOS transistors, and the PMOS transistors are replaced with NMOS transistors. Put differently, when the source line is coupled to the ground voltage, the sense amplifier circuit includes a first transistor configuration, and when the source line is coupled to the power supply voltage, the sense amplifier circuit includes a second transistor configuration that is swapped relative to the first transistor configuration.

Figure 15:
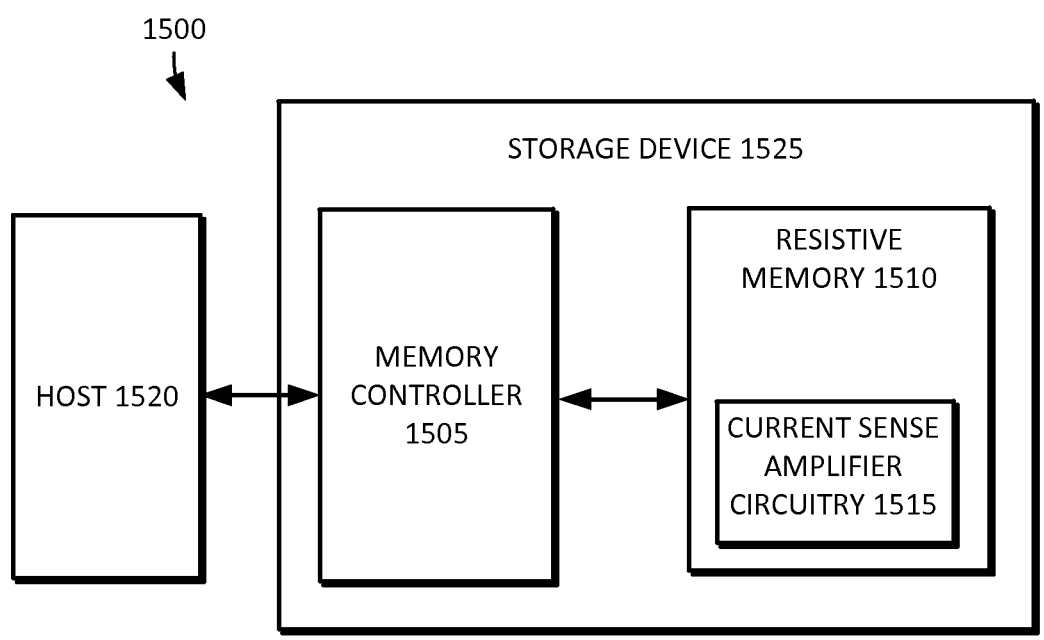
FIG. 15 is a block diagram schematically illustrating various applications of a resistive memory device, according to an embodiment of the inventive concept.

FIG. 15 is a block diagram schematically illustrating various applications of a resistive memory device, according to an embodiment of the inventive concept. Referring to FIG. 15, a memory system 1500 may include a storage device 1525 and a host 1520. The storage device 1525 may include a resistive memory 1510 and a memory controller 1505.

The storage device 1525 may include a storage medium such as a memory card (e.g., SD, MMC, etc.) or an attachable handheld storage device (e.g., USB memory, etc.). The storage device 1525 may be connected to the host 1520. The storage device 1525 may transmit and receive data to and from the host 1520 via a host interface. The storage device 1525 may be powered by the host 1520 to execute an internal operation. The resistive memory 1510 may include sense amplifier circuitry 1515 according to an embodiment of the inventive concept.

Figure 16:
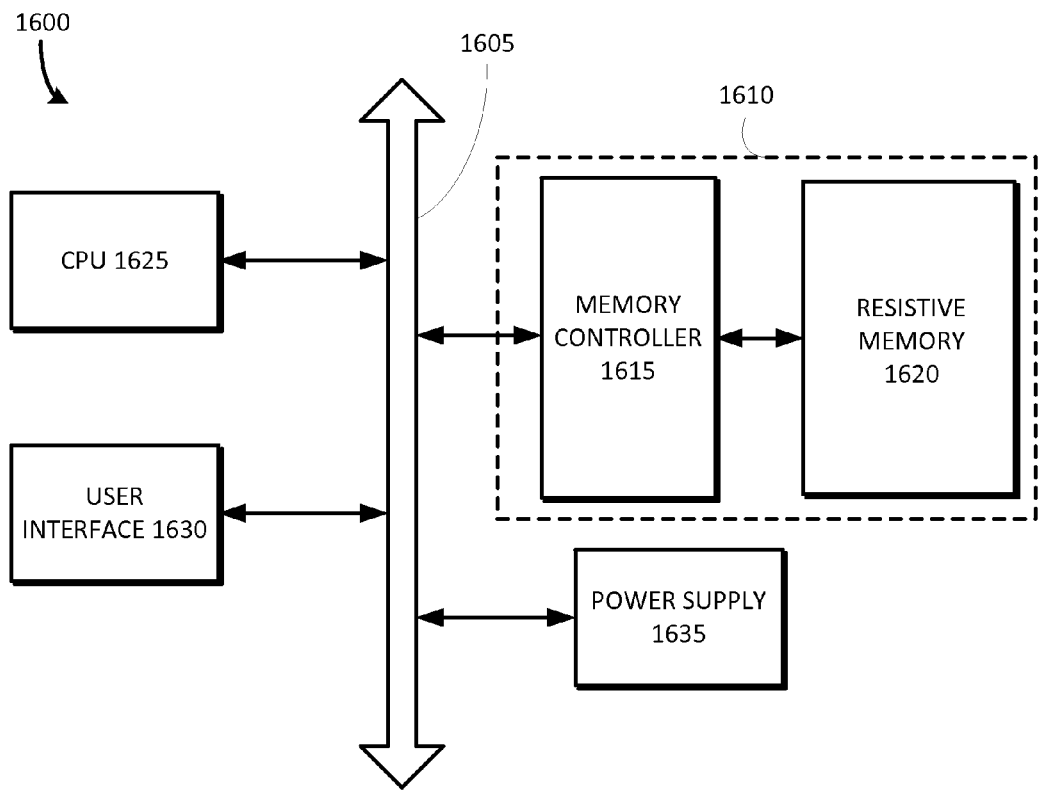
FIG. 16 is a block diagram of a computing system, including a resistive memory device, according to an embodiment of the inventive concept.

FIG. 16 is a block diagram of a computing system 1600, including a resistive memory device, according to an embodiment of the inventive concept. Referring to FIG. 16, the computing system 1600 includes a memory system 1610, a power supply 1635, a central processing unit (CPU) 1625, and a user interface 1630. The memory system 1610 includes a resistive memory device 1620 and a memory controller 1615. The CPU 1625 is electrically connected to a system bus 1605.

The resistive memory device 1620 may include sense amplifier circuitry according to an embodiment of the inventive concept. The resistive memory device 1620 stores data through the memory controller 1615. The data is received from the user interface 1630 or processed by the CPU 1625. The memory system 1600 may be used as a semiconductor disc device (SSD).

Figure 17:
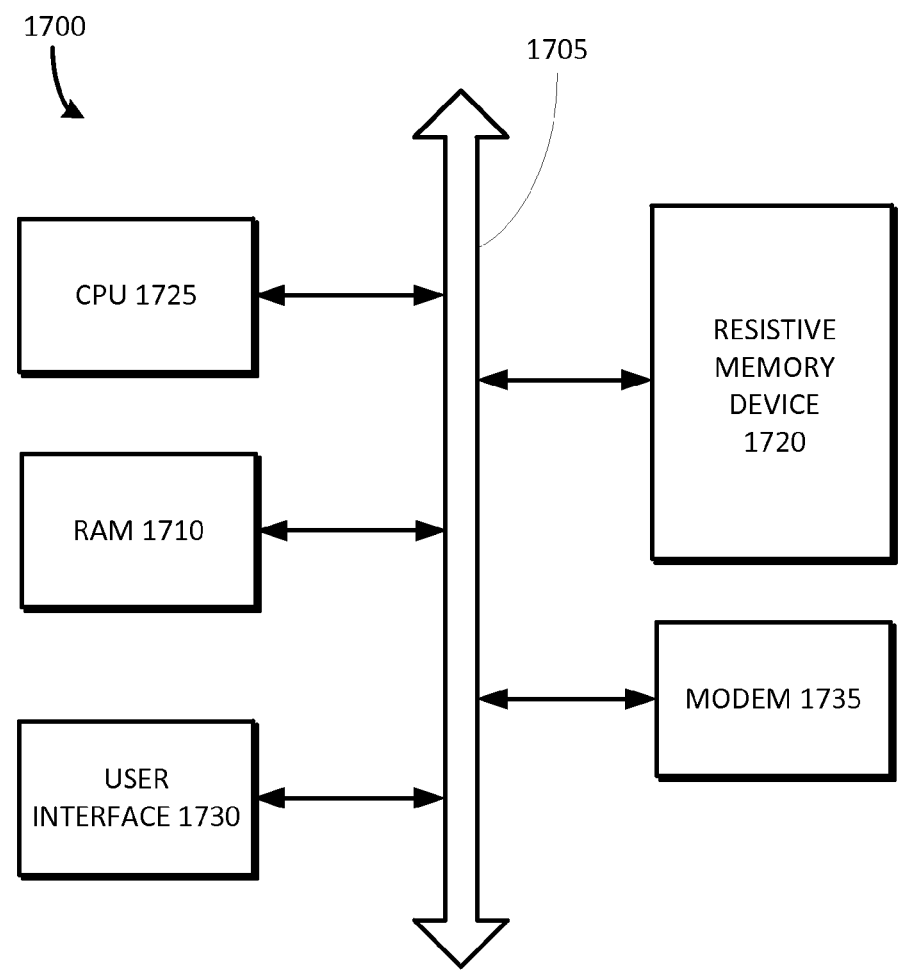
FIG. 17 is a block diagram schematically illustrating a computing system, including a resistive memory device, according to an embodiment of the inventive concept.

FIG. 17 is a block diagram schematically illustrating a computing system 1700, including a resistive memory device, according to an embodiment of the inventive concept. Referring to FIG. 17, the computing system 1700 may include a resistive memory device 1720, a CPU 1725, a RAM 1710, a user interface 1730, and a modem 1735 such as a baseband chipset, which are electrically connected to a system bus 1705. The resistive memory device 1720, as described above, may include sense amplifier circuitry according to an embodiment of the inventive concept.

If the computing system 1700 is a mobile device, it may further include a battery (not shown) which powers the computing system 1700. Although not shown in FIG. 17, the computing system 1700 may further include an application chipset, a camera image processor (CIS), a mobile DRAM, and the like.

A resistive memory device according to an embodiment of the inventive concept may be used as a storage class memory (SCM). The "storage class memory" may be the generic term for a memory which provides both the nonvolatile characteristic and random-access characteristic.

The above described PRAM, FeRAM, MRAM, and the like as well as the resistive memory (ReRAM) may be used as the storage class memory. Instead of a flash memory, the storage class memory may be used as a data storage memory. Further, instead of a synchronous DRAM, the storage class memory may be used as a main memory. Further, one storage class memory may be used instead of a flash memory and a synchronous DRAM.

Figure 18:
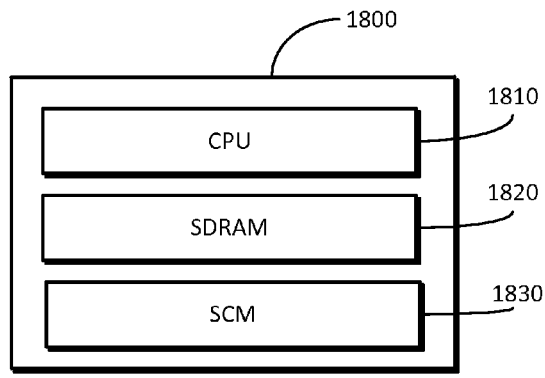
FIG. 18 is a block diagram schematically illustrating a memory system in which a flash memory is replaced with a storage class memory using a resistive memory, according to an embodiment of the inventive concept.

FIG. 18 is a block diagram schematically illustrating a memory system in which a flash memory is replaced with a storage class memory using a resistive memory, according to an embodiment of the inventive concept. Referring to FIG. 18, a memory system 1800 may include a CPU 1810, a synchronous DRAM (SDRAM) 1820, and a storage class memory (SCM) 1830. The SCM 1830 may be a resistive memory that is used as a data storage memory instead of a flash memory.

The SCM 1830 may access data in higher speed compared with a flash memory. For example, in a PC in which the CPU 1810 operates at a frequency of 4 GHz, a resistive memory being a type of SCM 1830 may provide an access speed higher than a flash memory. Thus, the memory system 1800 including the SCM 1830 may provide a relatively higher access speed than a memory system including a flash memory.

Figure 19:
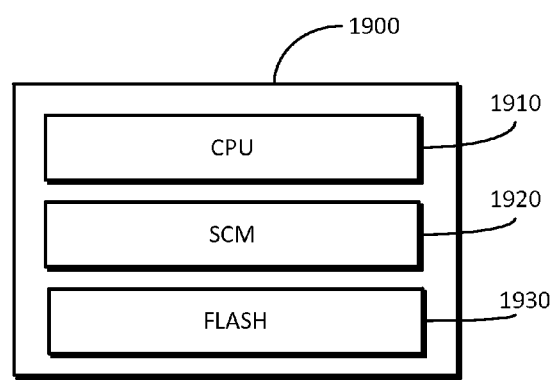
FIG. 19 is a block diagram schematically illustrating a memory system in which a synchronous DRAM is replaced with a storage class memory using a resistive memory, according to an embodiment of the inventive concept.

FIG. 19 is a block diagram schematically illustrating a memory system in which a synchronous DRAM is replaced with a storage class memory using a resistive memory, according to an embodiment of the inventive concept. Referring to FIG. 19, a memory system 1900 may include a CPU 1910, a storage class memory (SCM) 1920, and a flash memory 1930. The SCM 1920 may be used as a main memory instead of a synchronous DRAM (SDRAM).

Power consumed by the SCM 1920 may be less than that consumed by the SDRAM. A main memory may take about 40% of a power consumed by a computing system. For this reason, a technique of reducing power consumption of a main memory has been developed. Compared with the DRAM, the SCM 1920 may on average reduce 53% of dynamic energy consumption and about 73% of energy consumption due to power leak. Thus, the memory system 1900 including the SCM 1920 may reduce power consumption compared with a memory system including an SDRAM.

Figure 20:
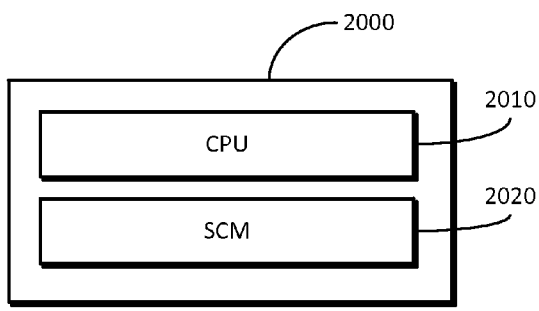
FIG. 20 is a block diagram schematically illustrating a memory system in which a synchronous DRAM and a flash memory are replaced with a storage class memory using a resistive memory according to an embodiment of the inventive concept.

FIG. 20 is a block diagram schematically illustrating a memory system in which a synchronous DRAM and a flash memory are replaced with a storage class memory using a resistive memory according to an embodiment of the inventive concept. Referring to FIG. 20, a memory system 2000 may include a CPU 2010 and a storage class memory (SCM) 2020. The SCM 2020 may be used as a main memory instead of a synchronous DRAM (SDRAM) and as a data storage memory instead of a flash memory. The memory system 2000 may be advantageous in the light of data access speed, low power, cost, and use of space.

A resistive memory device according to the inventive concept may be packed by at least one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The example embodiments disclosed herein provide a current sense amplifier circuit capable of using a lower power supply voltage. In addition, the current sense amplifier circuit embodiments disclosed herein provide faster read response times, less sensitivity on the parasitic difference between bit lines and reference lines, strong noise immunity by keeping signal average, and additional configurations using self-latching logic. It will be understood that different features from different embodiments can be combined in the same current sense amplifier circuit.

The above embodiments of the inventive concept are illustrative and not limitative. Various alternatives and equivalents are possible. The embodiments of the inventive concept are not limited by the type or the number of the magnetic random access memory cells included in a memory array. The embodiments of the inventive concept are not limited by the type of transistor, PMOS, NMOS or otherwise, included to operate the current sense amplifier circuit, select a magnetic tunnel junction device, or the like. The embodiments of the inventive concept are not limited by the type of logic gates, NOR or NAND included to implement logical column selection or to produce control logic for the current sense amplifier circuit. The embodiments of the inventive concept are not limited by the type of integrated circuit in which the inventive concept may be disposed. Nor are the embodiments of the inventive concept limited to any specific type of process technology, e.g., CMOS, Bipolar, or BICMOS that may be included to manufacture a memory. The embodiments described herein have been directed to current sense amplifier circuits but are not limited thereto. The embodiments described herein may be included wherever improving response times, noise immunity characteristics, low voltage operation capabilities, larger voltage headroom features, or fewer sense errors, or the like, may be found useful.

Other similar or non-similar modifications can be made without deviating from the intended scope of the invention. Accordingly, the invention is not limited except as by the appended claims.

What is claimed is:

1. A resistive type memory sense amplifier circuit, comprising:
    a first differential output terminal configured to output a first output signal;
    a second differential output terminal configured to output a second output signal opposite the first output signal;
    a first input terminal coupled to a bit line associated with a resistive type memory cell;
    a second input terminal coupled to a reference line associated with a reference memory cell;
    a first pre-charge transistor coupled to a power supply and to the first differential output terminal, the first pre-charge transistor being configured to pre-charge the bit line associated with the memory cell;
    a second pre-charge transistor coupled to the power supply and to the second differential output terminal, the second pre-charge transistor being configured to pre-charge the reference line associated with the reference memory cell;
    a first current modulating transistor coupled directly to the first differential output terminal and to the first pre-charge transistor, the first current modulating transistor being configured to operate in a saturation region mode during at least an amplification stage of the sense amplifier circuit; and
    a second current modulating transistor coupled directly to the second differential output terminal and to the second pre-charge transistor, the second current modulating transistor being configured to operate in the saturation region mode during at least the amplification stage of the sense amplifier circuit.

2. The resistive type memory sense amplifier circuit of claim 1, wherein:
    a drain of the first current modulating transistor is directly coupled to the first differential output terminal and to a drain of the first pre-charge transistor;
    a source of the first current modulating transistor is coupled to the bit line associated with the memory cell;

a drain of the second current modulating transistor is directly coupled to the second differential output terminal and to a drain of the second pre-charge transistor; and a source of the second current modulating transistor is coupled to the reference line associated with the reference memory cell, wherein the first and second current modulating transistors are configured to continuously average a bit line current and a reference line current, respectively, during the amplification stage.

3. The resistive type memory sense amplifier circuit of claim 2, wherein:

the sense amplifier circuit is a current sense amplifier circuit;

the first and second current modulating transistors are each an NMOS type transistor; and the first and second pre-charge transistors are each a PMOS type transistor.

4. The resistive type memory sense amplifier circuit of claim 1, further comprising a cross-coupled latch circuit connected to the first and second differential output terminals, wherein the cross-coupled latch circuit further comprises:

a latch enable transistor configured to enable a latch stage of the sense amplifier circuit responsive to a latch control signal;

a first latch transistor coupled to the power supply and to the first differential output terminal;

a second latch transistor coupled to the power supply and to the second differential output terminal;

a third latch transistor coupled to the first latch transistor and to the latch enable transistor; and a fourth latch transistor coupled to the second latch transistor and to the latch enable transistor, wherein the latch transistors are configured to latch, based on positive feedback, a logical value "0" or logical value "1" at the first or second differential output terminals, respectively, depending on a bit value stored in the resistive type memory cell, and responsive to the latch enable transistor being turned on by the latch control signal during the latch stage.

5. The resistive type memory sense amplifier circuit of claim 4, further compising:

a logic gate configured to receive the first and second output signals as inputs, and to generate the latch control signal.

6. The resistive type memory sense amplifier circuit of claim 5, wherein the logic gate is a NAND gate.

7. The resistive type memory sense amplifier circuit of claim 4, wherein:

the latch enable transistor is an NMOS type transistor;

the first and second latch transistors are each a PMOS type transistor; and the third and fourth latch transistors are each an NMOS type transistor.

8. The resistive type memory sense amplifier circuit of claim 4, wherein:

a source of the third latch transistor is directly coupled to a drain of the latch enable transistor; and a source of the fourth latch transistor is directly coupled to the drain of the latch enable transistor.

9. The resistive type memory sense amplifier circuit of claim 4, wherein:

a gate of the first latch transistor is coupled to the second differential output terminal;

a gate of the second latch transistor is coupled to the first differential output terminal;

a gate of the third latch transistor is coupled to the second differential output terminal; and a gate of the fourth latch transistor is coupled to the first differential output terminal.

10. The resistive type memory sense amplifier circuit of claim 9, wherein:

a drain of each of the first and third latch transistors is coupled to the first differential output terminal; and a drain of each of the second and fourth latch transistors is coupled to the second differential output terminal.

11. The resistive type memory sense amplifier circuit of claim 1, wherein:

the first pre-charge transistor is configured to receive a pre-charge control signal and to pre-charge the bit line associated with the memory cell during a pre-charge stage of the sense amplifier circuit responsive to the pre-charge control signal; and the second pre-charge transistor is configured to receive the pre-charge control signal and to pre-charge the reference line associated with the reference memory cell during the pre-charge stage of the sense amplifier circuit responsive to the pre-charge control signal.

12. The resistive type memory sense amplifier circuit of claim 1, wherein currents generated by the first and second pre-charge transistors do not flow through latch circuitry of the sense amplifier circuit.

13. The resistive type memory sense amplifier circuit of claim 1, wherein the resistive type memory cell includes at least one of a spin transfer torque (STT) magnetoresistive random-access memory (MRAM) cell, an MRAM cell, a memristor RAM cell, an ReRAM cell, or a CBRAM cell.

14. The resistive type memory sense amplifier circuit of claim 1, wherein the resistive type memory cell is a spin transfer torque (STT) magnetoresistive random-access memory (MRAM) cell.

15. The resistive type memory sense amplifier circuit of claim 1, further comprising a source line coupled to the memory cell, wherein:

the source line is coupled to one of a power supply voltage or a ground voltage;

when the source line is coupled to the ground voltage, the sense amplifier circuit includes a first transistor configuration; and when the source line is coupled to the power supply voltage, the sense amplifier circuit includes a second transistor configuration that is swapped relative to the first transistor configuration.

16. A method for sensing bit information stored in a resistive type memory, the method comprising:

in a pre-charge stage of a sense amplifier circuit, pre-charging, by a first pre-charge transistor and a second pre-charge transistor, a bit line and a reference line, respectively;

in an amplification stage of the sense amplifier circuit, continuously averaging a bit line current and a reference line current associated with the bit line and the reference line, respectively; and in a latch stage of the sense amplifier circuit, latching, by a latch circuit, a logical value "0" or logical value "1" at first or second differential output terminals, respectively, using positive feedback of the latch circuit.

17. The method of claim 16, wherein:

continuously averaging the bit line current and the reference line current includes operating a first current modulating transistor associated with the bit line in a saturation region mode during at least the amplification stage of the sense amplifier circuit, and operating a second current modulating transistor associated with the reference line in a saturation region mode during at least the amplification stage of the sense amplifier circuit.

18. The method of claim 16, further comprising:
in the latch stage of the sense amplifier circuit, receiving output signals of the first and second differential output terminals as inputs to a logic gate;
generating, by the logic gate, a latch control signal; and
controlling an operation of the latch circuit responsive to the latch control signal.

19. The method of claim 16, further comprising:
in the pre-charge stage of the sense amplifier circuit, generating, by the first and second pre-charge transistors, pre-charge currents associated with the bit line and the reference line, respectively;
wherein the pre-charge currents do not flow through any transistor of the latch circuit.

20. A resistive type memory device, comprising:
a plurality of word lines;
a plurality of bit lines arranged to intersect with the word lines;
a plurality of memory blocks, each memory block including resistive type memory cells arranged at intersection portions between the word lines and the bit lines;
a plurality of sense amplifier circuits, each sense amplifier circuit being associated with a corresponding bit line of one of the memory blocks; and
a current mirror circuit coupled to the plurality of sense amplifiers,
wherein the current mirror circuit is coupled to a reference line associated with a reference memory cell and is configured to:
pre-charge the reference line associated with the reference memory cell during a pre-charge stage of each of the sense amplifier circuits; and
mirror a reference line current during at least an amplification stage of each of the sense amplifier circuits.

21. The resistive type memory device of claim 20, further comprising:
a memory cell coupled to a bit line;
the reference memory cell coupled to the reference line; and
a sense amplifier circuit coupled to the memory cell through the bit line and coupled to the reference memory cell through the reference line,
wherein the sense amplifier circuit is configured to pre-charge the bit line and the reference line by first and second pre-charge transistors, respectively, continuously average a bit line current and a reference line current by first and second current modulating transistors associated with the bit line and the reference line, respectively, and latch a logical value "0" or logical value "1" at first or second differential output terminals associated with the bit line and the reference line, respectively, using positive feedback of a latch circuit.

22. The resistive type memory device of claim 20, wherein each of the sense amplifier circuits includes a latch circuit, the memory device further comprising:
a global latch enable transistor configured to enable a latch stage for each of the plurality of sense amplifier circuits responsive to a latch control signal.

23. The resistive type memory device of claim 20, wherein the plurality of sense amplifier circuits includes a shared sense amplifier circuit that is shared between first and second banks of memory cells.

24. The resistive type memory device of claim 20, wherein each of the sense amplifier circuits includes:

a first differential output terminal configured to output a first output signal;
a second differential output terminal configured to output a second output signal opposite the first output signal;
a first input terminal coupled to a bit line associated with a resistive type memory cell;
a second input terminal coupled to the reference line associated with the reference memory cell;
a first pre-charge transistor coupled to a power supply and to the first differential output terminal, the first pre-charge transistor being configured to pre-charge the bit line associated with the memory cell during the pre-charge stage of the sense amplifier circuit;
a second pre-charge transistor coupled to the power supply and to the second differential output terminal, the second pre-charge transistor and the current mirror circuit being configured to pre-charge the reference line associated with the reference memory cell during the pre-charge stage;
a first current modulating transistor coupled directly to the first differential output terminal and to the first pre-charge transistor, the first current modulating transistor being configured to operate in a saturation region mode during at least the amplification stage of the sense amplifier circuit;
a second current modulating transistor coupled directly to the second differential output terminal and to the second pre-charge transistor, the second current modulating transistor being configured to operate in the saturation region mode during at least the amplification stage of the sense amplifier circuit; and
a latch circuit coupled to the power supply and to the first and second differential output terminals and configured to latch a logical value "0" or logical value "1" during a latch stage of the sense amplifier circuit.

25. The resistive type memory device of claim 24, wherein the first and second banks of memory cells are arranged in an edge-reference cell pattern, wherein the pattern includes:
a first reference memory cell of the first bank disposed adjacent to and coupled to the shared sense amplifier circuit via a first reference line;
a second reference memory cell of the second bank disposed adjacent to and coupled to the shared sense amplifier circuit via a second reference line;
a first memory bit cell of the first bank coupled to the shared sense amplifier circuit via a first bit line; and
a second memory bit cell of the second bank coupled to the shared sense amplifier circuit via a second bit line.

26. The resistive type memory device of claim 24, wherein the first and second banks of memory cells are arranged in a word-reference cell pattern, wherein the pattern includes:
a memory bit cell of the first bank coupled to the shared sense amplifier circuit via a bit line; and
a reference memory cell of the second bank is coupled to the shared sense amplifier circuit via a reference line.

27. A resistive type memory device, comprising:
a plurality of word lines;
a plurality of bit lines arranged to intersect with the word lines;
a plurality of memory blocks, each memory block including resistive type memory cells arranged at intersection portions between the word lines and the bit lines;
a plurality of sense amplifier circuits, each sense amplifier circuit being associated with a corresponding bit line of one of the memory blocks; and
a current mirror circuit coupled to the plurality of sense amplifiers;

a memory cell coupled to a bit line;
a reference memory cell coupled to a reference line; and
a sense amplifier circuit coupled to the memory cell through the bit line and coupled to the reference memory cell through the reference line,
wherein the sense amplifier circuit is configured to pre-charge the bit line and the reference line by first and second pre-charge transistors, respectively, continuously average a bit line current and a reference line current by first and second current modulating transistors associated with the bit line and the reference line, respectively, and latch a logical value "0" or logical value "1" at first or second differential output terminals associated with the bit line and the reference line, respectively, using positive feedback of a latch circuit.

* * * * *